(12) United States Patent
Takyu et al.

(10) Patent No.: US 7,833,836 B2
(45) Date of Patent: Nov. 16, 2010

(54) STACK MCP AND MANUFACTURING METHOD THEREOF

(75) Inventors: Shinya Takyu, Kitakatsushika-gun (JP); Kazuhiro Iizuka, Yokohama (JP); Mika Kiritani, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 18 days.

(21) Appl. No.: 12/347,956

(22) Filed: Dec. 31, 2008

(65) Prior Publication Data

US 2009/0111218 A1 Apr. 30, 2009

Related U.S. Application Data

(60) Continuation of application No. 11/826,286, filed on Jul. 13, 2007, now Pat. No. 7,482,695, which is a division of application No. 10/891,513, filed on Jul. 15, 2004, now Pat. No. 7,285,864.

(30) Foreign Application Priority Data

Feb. 13, 2004 (JP) ............................. 2004-036446

(51) Int. Cl.
*H01L 21/00* (2006.01)
(52) U.S. Cl. ............... 438/118; 438/455; 257/E23.021; 257/E27.137; 257/E27.144; 257/E27.161
(58) Field of Classification Search ................. 438/118, 438/455; 257/E23.021, E27.137, E27.144, 257/E27.161
See application file for complete search history.

(56) References Cited

U.S. PATENT DOCUMENTS

| 5,481,133 | A | 1/1996 | Hsu |
| 6,452,278 | B1 | 9/2002 | DiCaprio et al. |
| 6,552,416 | B1 | 4/2003 | Foster |
| 6,564,449 | B1 | 5/2003 | Tsai et al. |
| 6,620,720 | B1 | 9/2003 | Moyer et al. |
| 6,762,122 | B2 | 7/2004 | Mis et al. |
| 6,863,109 | B2 * | 3/2005 | Kim et al. .................... 156/556 |
| 6,943,294 | B2 | 9/2005 | Kang et al. |
| 2002/0027295 | A1 * | 3/2002 | Kikuma et al. .............. 257/780 |

(Continued)

FOREIGN PATENT DOCUMENTS

JP 11-204720 7/1999

(Continued)

OTHER PUBLICATIONS

Notice of Reasons for Rejection in Application No. 2004-03446, Mailed Mar. 10, 2009 (4 pages).

(Continued)

*Primary Examiner*—Michelle Estrada
(74) *Attorney, Agent, or Firm*—Finnegan, Henderson, Farabow, Garrett & Dunner, L.L.P.

(57) ABSTRACT

A semiconductor chip having an adhesive layer previously formed on an element forming surface thereof and having a bump exposed from the surface of the adhesive layer is wire-bonded to a printed circuit board. Another semiconductor chip is stacked on the above semiconductor chip with the adhesive layer disposed therebetween and is wire-bonded to the printed circuit board by wire bonding. Likewise, at least one semiconductor chip is sequentially stacked on the thus attained semiconductor structure to form a stack MCP.

15 Claims, 10 Drawing Sheets

U.S. PATENT DOCUMENTS

| | | |
|---|---|---|
| 2002/0096785 A1 | 7/2002 | Kimura |
| 2003/0153124 A1 | 8/2003 | Tomimatsu |
| 2003/0160312 A1 | 8/2003 | Lo et al. |
| 2004/0009631 A1 | 1/2004 | Connell et al. |
| 2004/0194882 A1 | 10/2004 | Hung |
| 2006/0263620 A1 | 11/2006 | Vanderstappen et al. |

FOREIGN PATENT DOCUMENTS

| | | |
|---|---|---|
| JP | 2002-222913 | 8/2002 |
| JP | 2002-261233 | 9/2002 |
| JP | 2003-17513 | 1/2003 |
| JP | 2003-100803 | 4/2003 |
| TW | 442876 | 6/2001 |

OTHER PUBLICATIONS

Shinya Takyu et al., "Semiconductor Device Manufacturing Method for Reinforcing Chip by Use of Seal Member at Pickup Time," U.S. Appl. No. 10/187,629, filed Jul. 3, 2002, now US Patent No. 6,777,313.

Communication Brief of Comments on Examination issued by Taiwan Intellectual Properties Office for Taiwanese Patent Application No. 93123397, and English translation thereof.

Notification of First Office Action issued on Apr. 6, 2007 from the Chinese Patent Office in counterpart Chinese Patent Application No. 2004100584767, and English translation thereof.

* cited by examiner

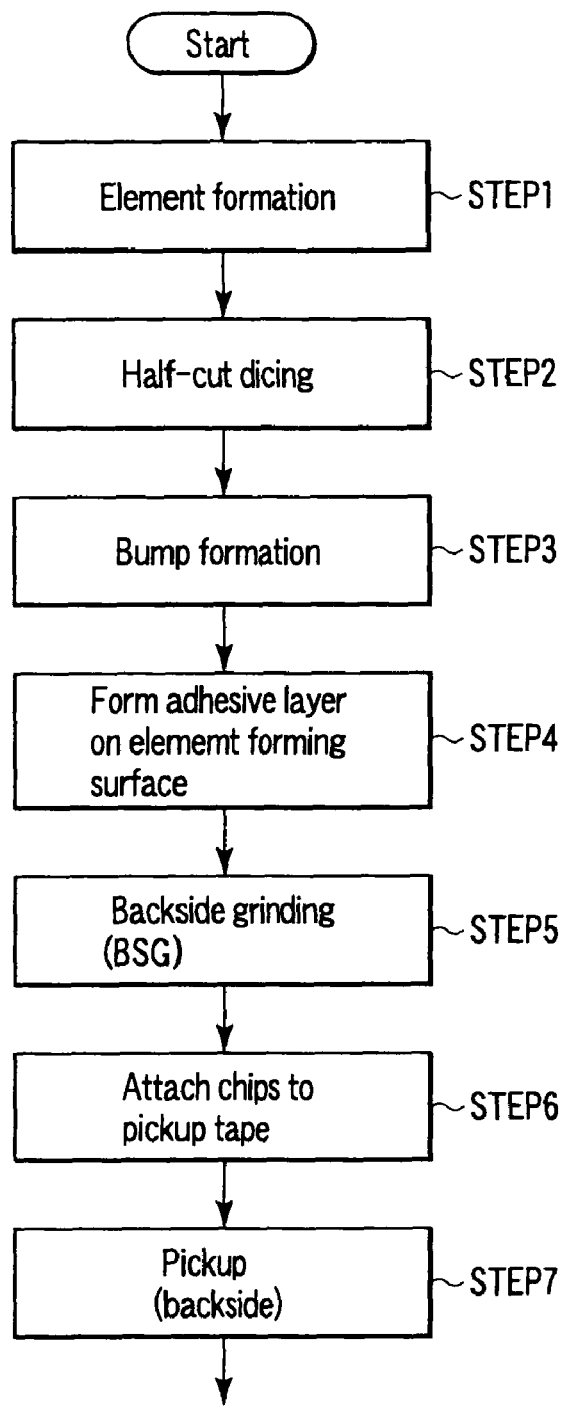
F I G. 1 2
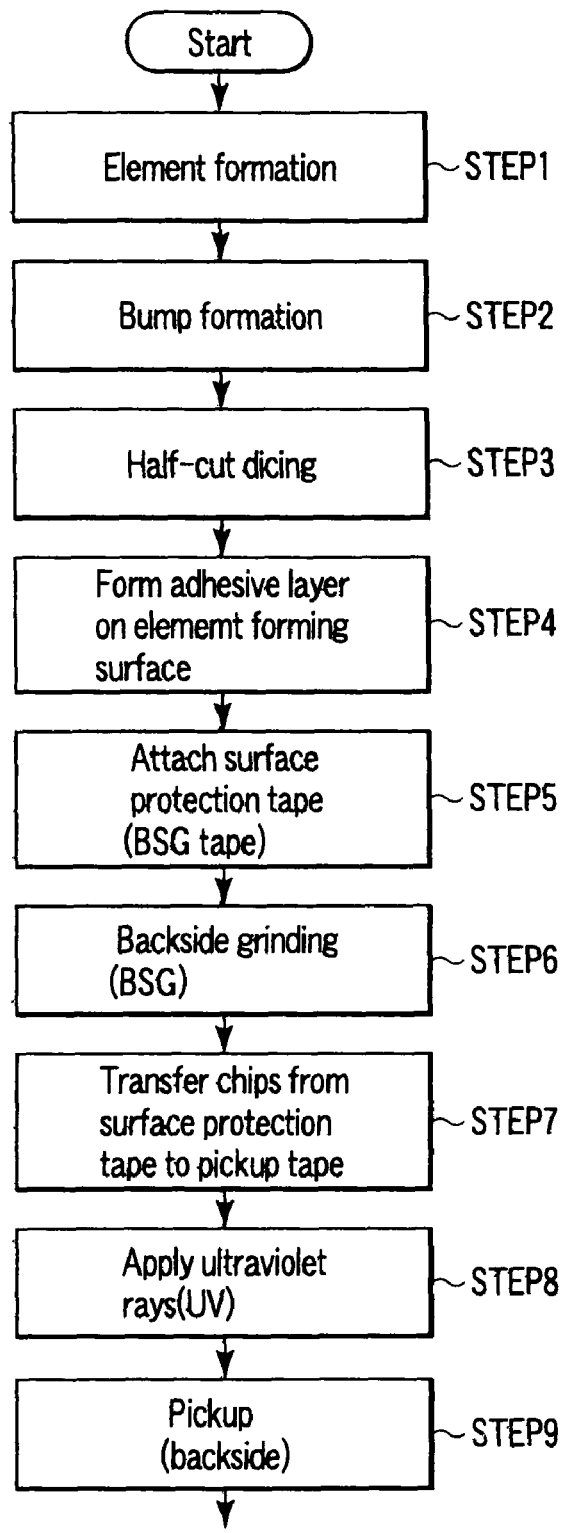
F I G. 1 3

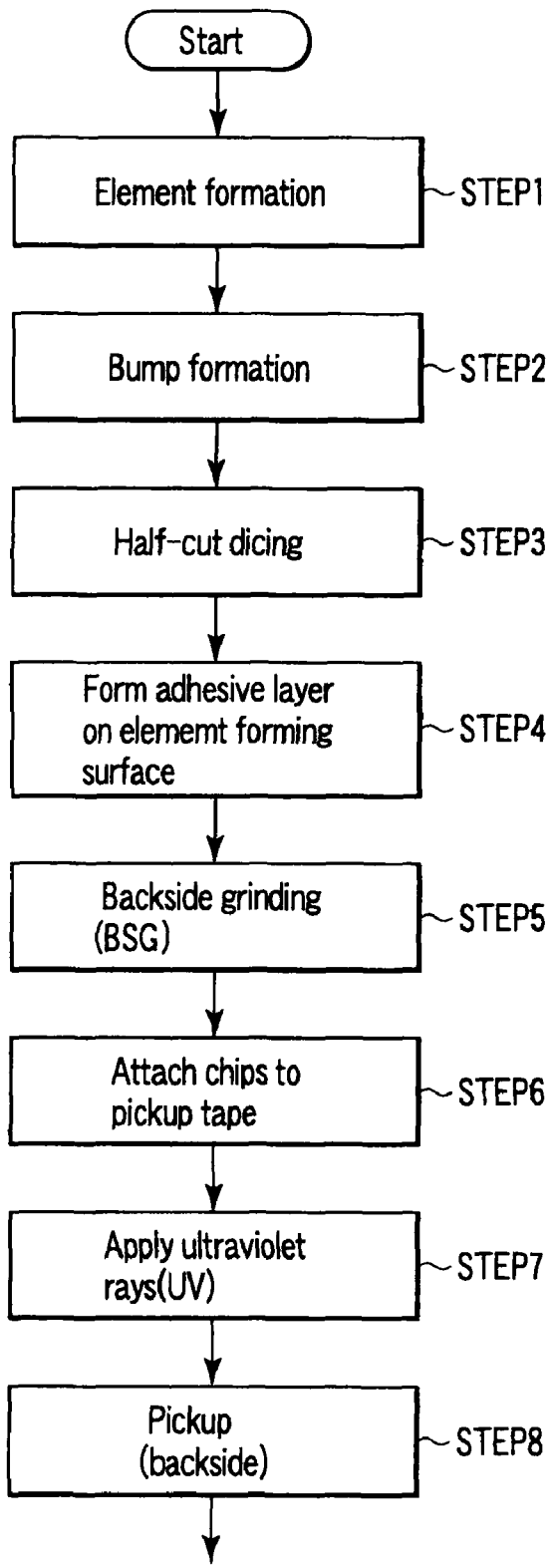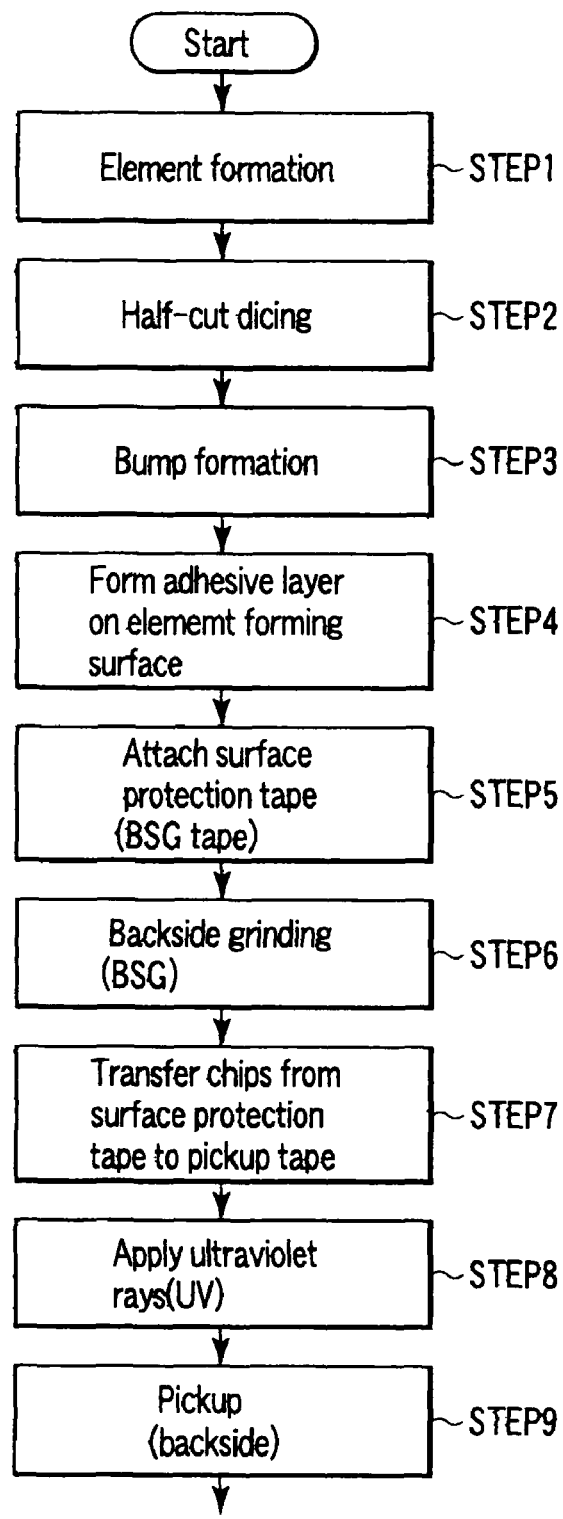
FIG. 14
FIG. 15

STACK MCP AND MANUFACTURING METHOD THEREOF

CROSS-REFERENCE TO RELATED APPLICATIONS

This is a continuation of application Ser. No. 11/826,286, filed Jul. 13, 2007, now U.S. Pat. No. 7,482,695, which is a divisional of application Ser. No. 10/891,513 (now U.S. Pat. No. 7,285,864), filed Jul. 15, 2004, and claims the benefit of priority from Japanese Application No. 2004-036446, filed Feb. 13, 2004, the entire contents of all which are incorporated herein by reference.

BACKGROUND OF THE INVENTION

1. Field of the Invention

This invention relates to a semiconductor device and a manufacturing method thereof and more particularly to a stack multi-chip package (MCP) having a plurality of semiconductor chips stacked and packaged.

2. Description of the Related Art

Conventionally, a stack MCP is formed by performing the process for forming elements on a semiconductor wafer, grinding the backside of the wafer, attaching film-like adhesive to the backside, dicing the wafer to form semiconductor chips, stacking and mounting the chips in a plural-stage form by repeatedly performing the process for mounting the thus formed chips and the wire bonding process, and then resin-molding the thus stacked chips.

FIG. 1 is a cross-sectional view showing an enlarged portion of a conventional stack MCP. In this case, an example wherein four semiconductor chips are stacked and mounted is shown. A semiconductor chip 13-1 is mounted on a chip mounting portion of a printed circuit board 11 with an adhesive layer 12-1 disposed therebetween. A pad 14-1 of the chip 13-1 and a wiring layer 15-1 on the printed circuit board 11 are electrically connected to each other via a bonding wire 16-1.

A second semiconductor chip 13-2 smaller than the chip 13-1 is mounted on the first semiconductor chip 13-1 with an adhesive layer 12-2 disposed therebetween. A pad 14-2 of the chip 13-2 and a wiring layer 15-2 on the printed circuit board 11 are electrically connected to each other via a bonding wire 16-2.

A spacer 17 smaller than the chip 13-2 is formed on the second semiconductor chip 13-2 with an adhesive layer 12-3 disposed therebetween. As the spacer 17, for example, a chip (which is called a spacer chip) on which no element is formed can be used.

A semiconductor chip 13-3 having substantially the same size as the chip 13-1 is mounted on the spacer 17 with an adhesive layer 12-4 disposed therebetween. A pad 14-3 of the chip 13-3 and a wiring layer 15-3 on the printed circuit board 11 are electrically connected to each other via a bonding wire 16-3.

A semiconductor chip 13-4 having substantially the same size as the chip 13-2 is mounted on the semiconductor chip 13-3 with an adhesive layer 12-5 disposed therebetween. A pad 14-4 of the chip 13-4 and a wiring layer 15-4 on the printed circuit board 11 are electrically connected to each other via a bonding wire 16-4.

The chips 13-1 to 13-4 and spacer 17 mounted in a stack form and the bonding wires 16-1 to 16-4 are sealed into a resin package 18.

Multi-layered wiring (not shown) is formed in the printed circuit board (multi-layer printed circuit board) 11, and the wiring layers 15-1 to 15-4 formed on the chip mounting surface of the printed circuit board 11 are electrically connected to respective wiring layers 19-1 to 19-4 formed on the backside thereof. Solder balls 20-1 to 20-4 for external connection are formed in an array form on the wiring layers 19-1 to 19-4 (BGA).

However, the above stack MCP and the manufacturing method thereof have the following problems (a) to (f).

(a) Semiconductor chips are formed by attaching film-like adhesive onto the wafer backside after the backside of the semiconductor wafer is ground and dividing the wafer by dicing. Therefore, backside chipping occurs in the dicing process in many cases and only chips which are low in bending strength can be formed. Thus, it is only possible to form chips with a thickness of 100 to 150 μm or more (for example, refer to Jpn. Pat. Appln. KOKAI Publication No. 11-204720).

(b) As described in (a), since chipping often occurs on the backside of the thus formed semiconductor chip, there occurs a possibility that cracks will occur in the chip at the time of wire bonding onto the element forming surface.

(c) As a method for solving the problems of (a) and (b), it is considered that a dicing before grinding (DBG) method (for example, refer to Jpn. Pat. Appln. KOKAI Publication No. 2003-17513) is used. However, if film-like adhesive is attached to the backsides of chips in order to mount the chips in a stack form after the wafer is divided by the dicing before grinding method, the divided chips will stick together and it becomes necessary to cut the film-like adhesive on the backside. The cutting process can be made unnecessary if film-like adhesive is attached to the individual chips. However, if film-like adhesive is individually attached to a large number of chips, the manufacturing process becomes complicated.

(d) Further, as another method for solving the problems of (a) and (b), a method for enhancing the bending strength of the chip by etching the ground surface to eliminate chipping after the backside of the semiconductor wafer is ground is considered. However, with this method, if the chip thickness is reduced to 100 μm or less, cracks or breakage larger than those occurring in a case where no etching process is performed may occur. As a result, there occurs a possibility that the number of faulty chips is increased.

(e) When the sizes of chips to be stacked are substantially the same, wire bonding is performed for the upper-side chip in a suspended state and the possibility that poor connection occurs becomes strong if the rigidity of a thin chip is low. For example, in FIG. 1, the wire bonding portion of the chip 13-3 has an overhung of ΔL from the end portion of the spacer 17 and the end portion of the chip 13-3 is ball-bonded in a suspended state (in a non-fixed state). At this time, the bonding position may be deviated due to warping of the chip 13-3 or cracks will occur due to pressure at the bonding time. Further, if cracks do not occur, there occurs a possibility that the chip 13-3 will be bent and brought into contact with the lower-side bonding wire 16-2, thereby causing poor connection.

(f) In order to alleviate problem (e), a method for eliminating chipping and warping by etching the ground surface after the backside of the semiconductor wafer is ground is considered. However, even if the problem of cracking and warping can be solved by the above method, a problem of poor connection caused by bending of the chip 13-3 by pressure at the ball bonding time cannot be solved.

BRIEF SUMMARY OF THE INVENTION

According to an aspect of the invention there is provided a semiconductor device comprising a plurality of semiconductor chips stacked and packaged, at least one of the plurality of semiconductor chips including an adhesive layer formed on an element forming surface of the semiconductor chip, a bump formed on a pad on the semiconductor chip and exposed from the surface of the adhesive layer, and a bonding wire which electrically connects the bump to a wiring layer formed on a printed circuit board.

According to another aspect of the invention there is provided a method of manufacturing a semiconductor device comprising performing first ball bonding to bond a first bonding ball onto a first bump which is formed on a first pad of a first semiconductor chip having a first adhesive layer formed on an element forming surface thereof and is exposed from a surface of the first adhesive layer, performing first wedge bonding with respect to a first wiring layer formed on a printed circuit board by extending a bonding wire from the first bonding ball, mounting a second semiconductor chip having a second adhesive layer formed on an element forming surface thereof, having a second bump formed on a second pad and exposed from a surface of the second adhesive layer and smaller than the first semiconductor chip on a portion of the first adhesive layer which lies inside the first pad on the first semiconductor chip, performing second ball bonding to bond a second bonding ball onto a second bump on the second semiconductor chip, and performing second wedge bonding with respect to a second wiring layer formed on the printed circuit board by extending a bonding wire from the second bonding ball.

BRIEF DESCRIPTION OF THE SEVERAL VIEWS OF THE DRAWING

FIG. 12 is a manufacturing process diagram for illustrating a modification 7 of the manufacturing method of the semiconductor device according to the embodiment of this invention;

FIG. 13 is a manufacturing process diagram for illustrating a modification 8 of the manufacturing method of the semiconductor device according to the embodiment of this invention;

FIG. 14 is a manufacturing process diagram for illustrating a modification 9 of the manufacturing method of the semiconductor device according to the embodiment of this invention;

FIG. 15 is a manufacturing process diagram for illustrating a modification 10 of the manufacturing method of the semiconductor device according to the embodiment of this invention;

DETAILED DESCRIPTION OF THE INVENTION

Figure 1:
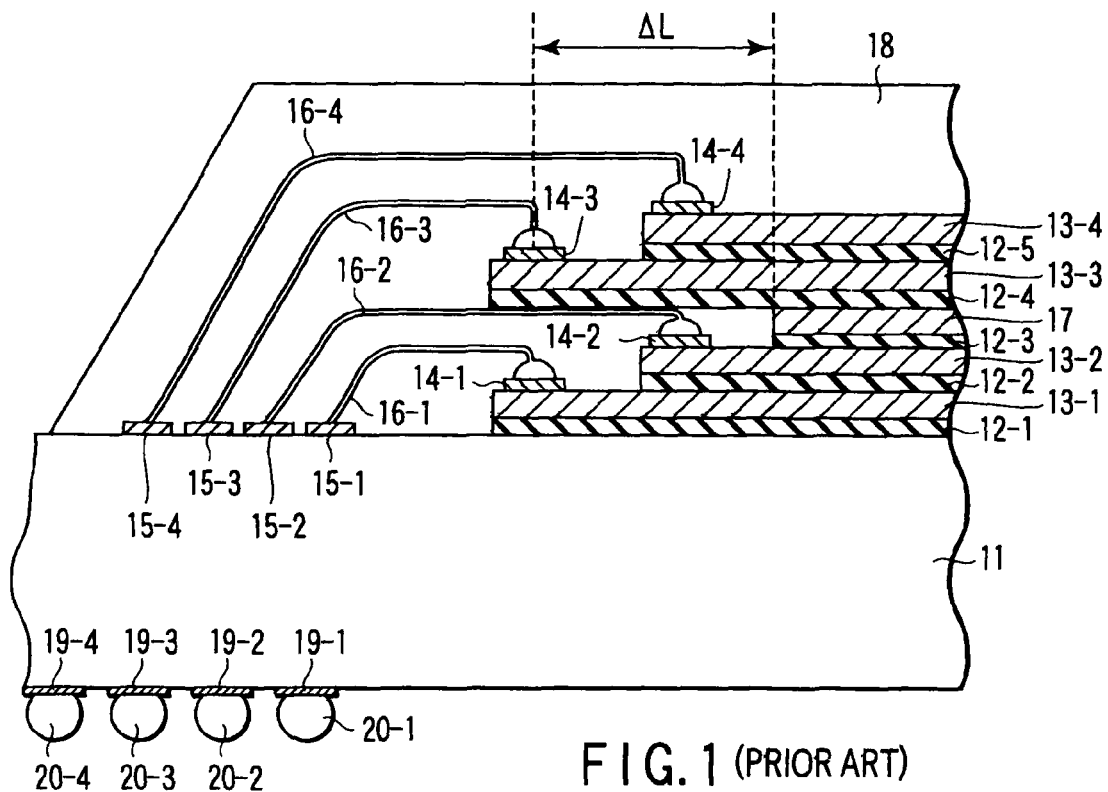
FIG. 1 is a cross-sectional view showing an enlarged portion of a stack MCP, for illustrating a conventional semiconductor device and a manufacturing method thereof.
Figure 2:
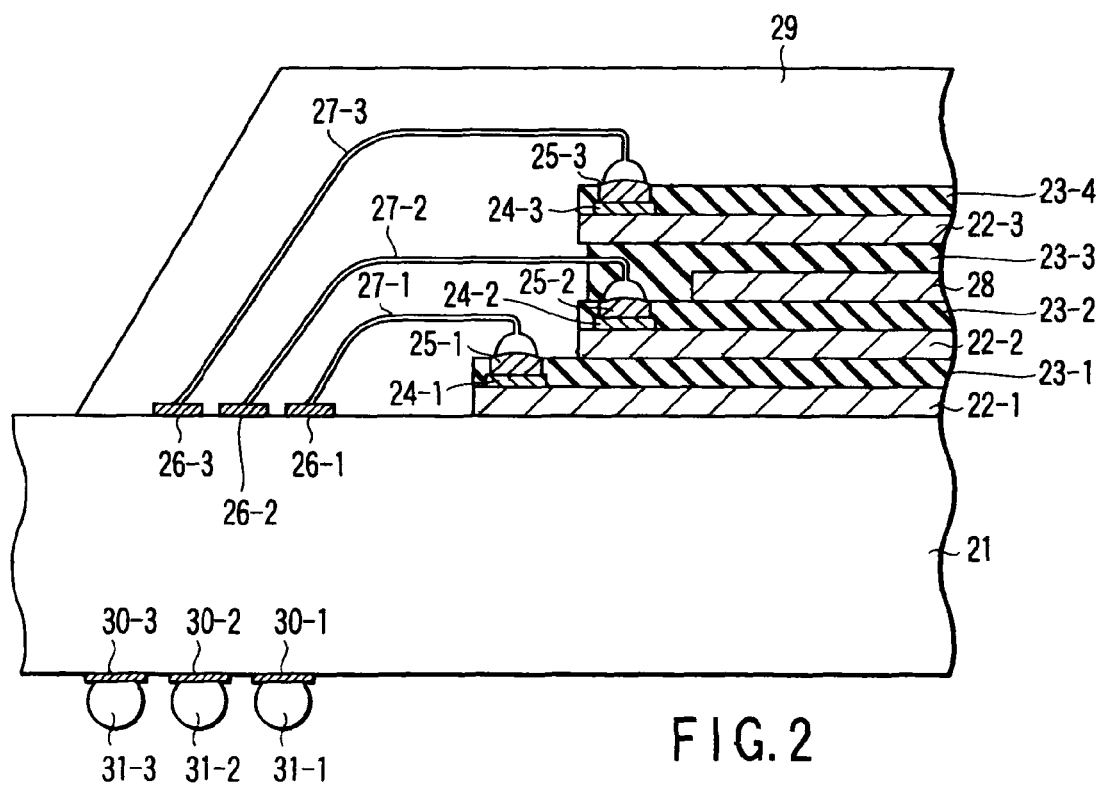
FIG. 2 is a cross-sectional view showing an enlarged portion of a stack MCP, for illustrating a semiconductor device according to one embodiment of this invention and a manufacturing method thereof.

FIG. 2 is a cross-sectional view showing an enlarged portion of a stack MCP, for illustrating a semiconductor device according to one embodiment of this invention. For simplicity of explanation, a case wherein three semiconductor chips are stacked and packaged is shown as an example.

A semiconductor chip 22-1 is mounted on a chip mounting portion of a printed circuit board 21. An adhesive layer 23-1 is disposed on the element forming surface of the chip 22-1. A bump (stud bump or plated bump) 25-1 is formed on a pad 24-1 of the chip 22-1 and the bump 25-1 is exposed (or projected) from the surface of the adhesive layer 23-1. The bump 25-1 and a wiring layer 26-1 on the printed circuit board 21 are electrically connected to each other via a bonding wire 27-1.

A semiconductor chip 22-2 is mounted on the semiconductor chip 22-1 with the adhesive layer 23-1 disposed therebetween. The chip 22-2 is smaller than the chip 22-1 and mounted on a portion of the adhesive layer 23-1 which lies inside the pad 24-1. Preferably, the chip 22-2 has a size such that the peripheral portion thereof will be inwardly disposed at a distance of 50 μm to 2000 μm from the pad 24-1 on the chip 22-1 which is formed below the chip 22-2. An adhesive layer 23-2 is formed on the element forming surface of the chip 22-2. A bump (stud bump or plated bump) 25-2 is formed on a pad 24-2 of the chip 22-2 and the bump 25-2 is exposed (or projected) from the surface of the adhesive layer 23-2. The bump 25-2 and a wiring layer 26-2 on the printed circuit board 21 are electrically connected to each other via a bonding wire 27-2.

A spacer 28 smaller than the chip 22-2 is formed on the adhesive layer 23-2. As the spacer 28, for example, a chip (spacer chip) on which no elements are formed can be used. The spacer 28 is mounted on a portion of the adhesive layer 23-2 which is disposed inside the pad 24-2. Preferably, the spacer 28 has a size such that the peripheral portion thereof will be inwardly disposed at a distance of 50 μm to 2000 μm from the pad 24-2 on the chip 22-2 which is formed below the spacer 28. An adhesive layer 23-3 is formed on the spacer 28. The adhesive layer 23-3 has a fillet used to bury the ball bonding portion of the bonding wire 27-2.

A third semiconductor chip 22-3 having substantially the same size as the chip 22-2 is mounted on the adhesive layer 23-3. An adhesive layer 23-4 is formed on the element forming surface of the chip 22-3. A bump (stud bump or plated bump) 25-3 is formed on a pad 24-3 of the chip 22-3 and the bump 25-3 is exposed (or projected) from the surface of the adhesive layer 23-4. The bump 25-3 and a wiring layer 26-3 on the printed circuit board 21 are electrically connected to each other via a bonding wire 27-3.

The chips 23-1 to 23-3 and spacer 28 mounted in a stack form and the bonding wires 26-1 to 26-3 are sealed into a resin package 29.

A multi-layered wiring (not shown) is formed in the printed circuit board (multi-layer printed circuit board) 21 and the wiring layers 26-1 to 26-3 formed on the chip mounting surface of the printed circuit board 21 are electrically connected to respective wiring layers 30-1 to 30-3 formed on the backside thereof. Solder balls 31-1 to 31-3 for external connection are formed in an array form on the wiring layers 30-1 to 30-3 (BGA). As the external connection terminals, various structures of not only BGA but also PGA or the like can be used.

Figure 3A:
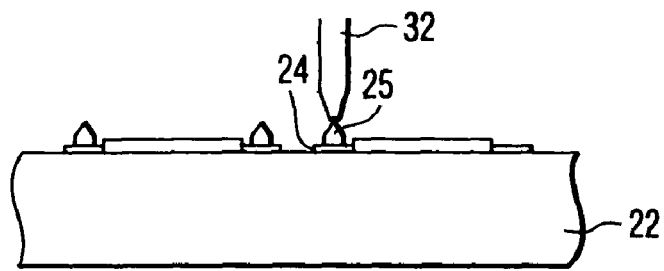
FIGS. 3A to 3F are cross-sectional views sequentially showing the manufacturing steps of semiconductor chips in the MCP shown in FIG. 2.
Figure 4:
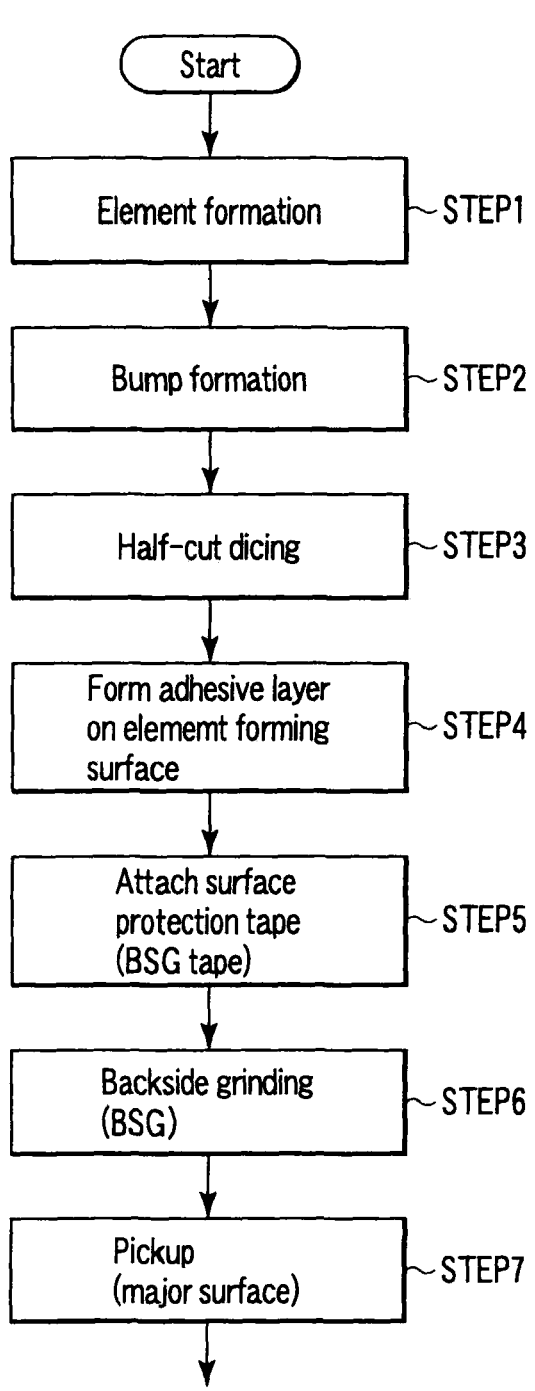
FIG. 4 is a manufacturing process diagram showing the manufacturing process of the semiconductor chips in the MCP shown in FIG. 2.
Figure 5:
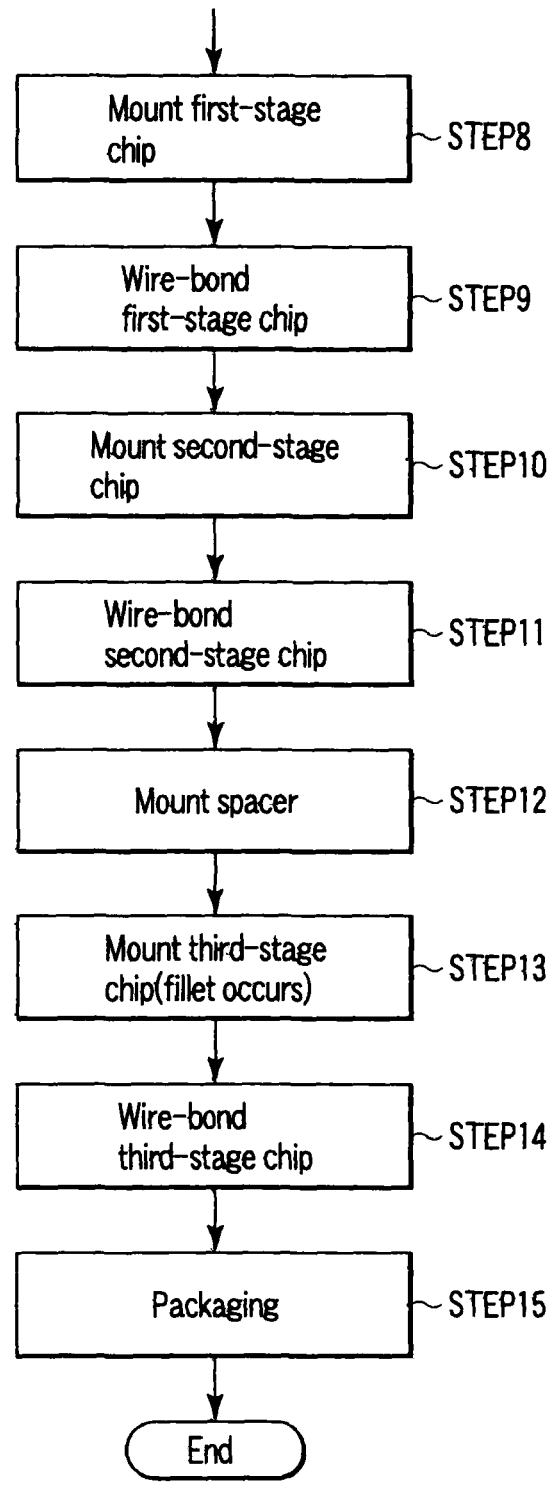
FIG. 5 is a manufacturing process diagram showing a mounting process in the MCP shown in FIG. 2.

Next, the manufacturing method of the stack MCP with the above structure is explained with reference to FIGS. 3A to 3F, 4 and 5. FIGS. 3A to 3F are cross-sectional views sequentially showing the manufacturing steps of semiconductor chips, FIG. 4 is a diagram showing the manufacturing process of the semiconductor chip and FIG. 5 is a manufacturing process diagram showing a mounting process.

In the steps shown in FIGS. 3A to 3F and 4, semiconductor chips 22-1, 22-2, 22-3 each having an adhesive layer formed on the element forming surface of the semiconductor chip and bumps exposed from the adhesive layer are formed. The chips 22-1, 22-2, 22-3 are formed in the same manner except for the element forming process and formed as follows.

That is, various elements are formed on a semiconductor wafer (semiconductor substrate) by use of a known process (STEP1). Then, as shown in FIG. 3A, bumps 25 are formed on pads 24 corresponding to each chip of the wafer 22 on which elements have already been formed (STEP2). In this case, an example wherein stud bumps are formed is shown and the bumps 25 electrically connected to the elements are formed by use of a capillary 32.

Figure 3B:
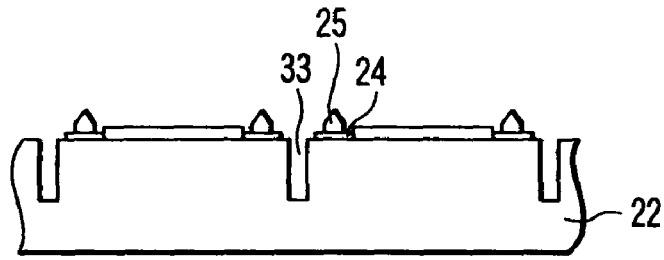

After this, as shown in FIG. 3B, grooves 33 having a depth which does not reach the backside of the wafer are formed along dicing lines or chip dividing lines of the wafer 22 starting from the element forming surface by use of a diamond scriber, diamond blade, laser scriber or the like. Thus, a so-called half-cut dicing process is performed (STEP3).

Figure 3C:
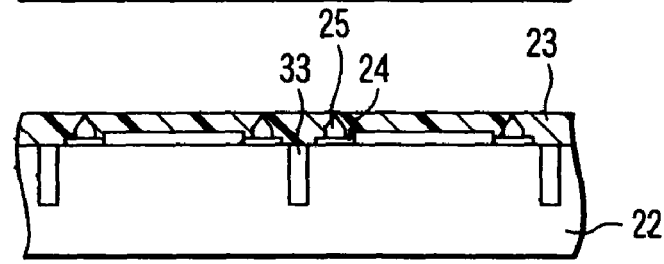

Next, as shown in FIG. 3C, a film-like adhesive agent is attached to the element forming surface of the wafer 22 to form an adhesive layer 23 (STEP4). Then, the adhesive layer 23 is heated as required so as to cause the bumps 25 to be exposed from the surface of the adhesive layer 23. The adhesive layer 23 can be formed by using a liquid-form adhesive agent and coating the adhesive agent by spin coating to cover the wafer except for the upper portions of the bumps 25.

Figure 3D:
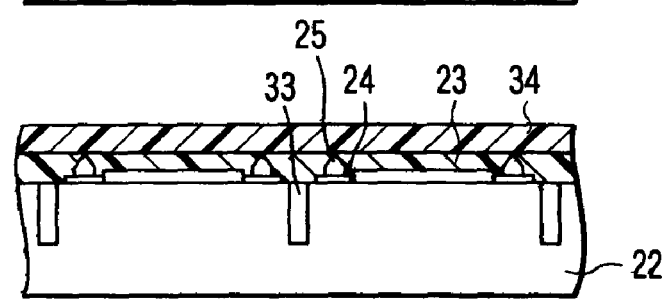
Figure 3E:
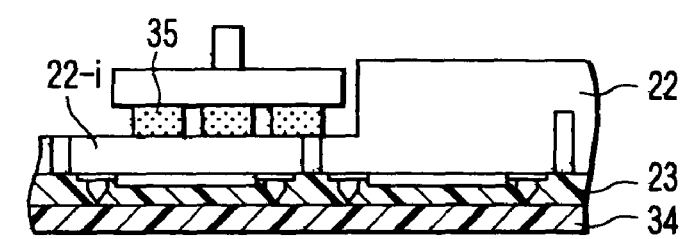

Then, a surface protection tape (BSG tape) 34 is attached onto the adhesive layer 23 as shown in FIG. 3D (STEP5) and the backside of the wafer 22 is ground by use of a grindstone 35 as shown in FIG. 3E (STEP6). Thus, the process for reducing the thickness of the wafer 22 and the process for dividing the wafer into individual chips 22-$i$ (i=1, 2, 3) are simultaneously performed (dicing before grinding).

Figure 3F:
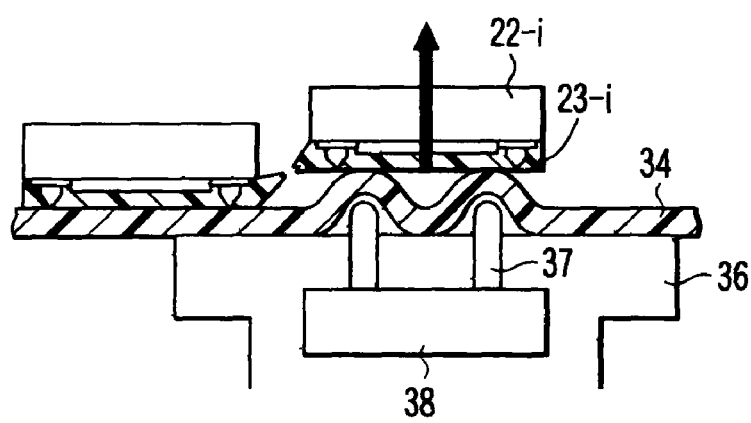

After the end of grinding, the individually divided chips 22-$i$ are mounted on a fixing table of a pickup device and the fixing table is moved in the XY direction so as to set the pickup tool to correspond to the chip 22-$i$ which is to be next picked up. Then, as shown in FIG. 3F, the space inside a backup holder 36 of the pickup device is evacuated to attract and fix the surface protection tape 34 on the upper surface of the backup holder 36. In this state, a pin holder 38 having thrust pins 37 mounted thereon is moved up to project the thrust pins 37 from the upper surface of the backup holder 36. As a result, the chip 22-$i$ is pushed up in an arrow direction from the adhesive layer 23 side with the surface protection tape 34 disposed therebetween so as to strip or separate the corner portions of the chip 22-$i$ from the surface protection tape 34. Further, the backside of the chip 22-$i$ is chucked by use of a suction tool which is called a collet to completely take off and pick up the chip (STEP7). At this time, the adhesive layer 23 (23-$i$) is torn off and cut off in a position corresponding to the groove 33.

After the semiconductor chips 22-1, 22-2, 2.2-3 are thus formed, the process for mounting the chips on the printed circuit board 21 and packaging them is performed according to the procedure as shown in FIG. 5.

First, the positional relation between a first-stage chip 22-1 and the printed circuit board 21 is determined and then the chip 22-1 is mounted in the chip mounting position (STEP8). Then, a bonding ball is bonded onto a bump 25-1 of the chip 22-1 and a wire (bonding wire 27-1) is extended from the bonding ball to make wedge bonding with respect to a wiring layer 26-1 formed on the printed circuit board 21 (STEP9).

Next, a second-stage chip 22-2 which is smaller than the chip 22-1 is mounted on a portion of an adhesive layer 23-1 which is formed inside a pad 24-1 on the chip 22-1 (STEP10). A bonding ball is bonded onto a pad 24-2 of the chip 22-2 and a wire (bonding wire 27-2) is extended from the bonding ball to make wedge bonding with respect to a wiring layer 26-2 formed on the printed circuit board 21 (STEP11).

Then, a spacer 28 which has an adhesive layer 23-3 formed on the upper surface thereof and is smaller than the chip 22-2 is mounted on a portion of an adhesive layer 23-2 which is formed inside a pad 24-2 on the chip 22-2 (STEP12). As the adhesive layer 23-3, a material having low viscosity is selected.

After this, a chip 22-3 having an adhesive layer 23-4 formed on the element forming surface thereof and having a bump 25-3 formed on the pad 24-3 and exposed from the surface of the adhesive layer 23-4 is mounted on the adhesive layer 23-3 (STEP13). The step is a thermocompression bonding step. That is, a fillet is formed to reach the ball bonding portion on the chip 22-2 by melting the adhesive layer 23-3 on the spacer 28 and thus the edge portion of the chip 22-3 is reinforced.

In this state, a bonding ball is bonded onto the bump 25-3 of the chip 22-3 and a wire (bonding wire 27-3) is extended from the bonding ball to make wedge bonding with respect to a wiring layer 26-3 formed on the printed circuit board 21 (STEP14).

Then, after the chip 22-2, spacer 28 and chip 22-3 are sequentially stacked on the chip 22-1 and wire-bonded as described above, they are packaged by use of resin molding or the like (STEP15) to complete a stack MCP as shown in FIG. 2.

According to the above manufacturing method, since the element forming surface of the wafer 22 is coated with the adhesive layer 23 after forming the bumps 25, a portion other than the bumps 25 is covered with the adhesive layer 23 and apparent projections of the bumps 25 can be eliminated. Thus, since the structure can be made flat, occurrence of cracks in the wafer at the backside grinding time and a lowering in the manufacturing yield can be suppressed. In the conventional case, with high bumps such as ball bumps or stud bumps, step differences caused by projections of the bumps cannot be absorbed by use of the surface protection tape 34 used for backside grinding and there occurs a possibility that the wafer will be cracked. However, since the surface protection tape 34 is attached to the adhesive layer 23 to absorb the step difference by use of the two members, it becomes possible to cope with bumps higher than the conventional bumps. Further, in a case where a liquid-form adhesive agent is spin-coated, the step difference can be absorbed irrespective of the height of the bump 25 by adjusting the thickness of the adhesive layer 23 and high bumps such as ball bumps or stud bumps can be used.

Since a chip is picked up in a state in which the chip 22-i and the adhesive layer 23 are formed in an integral form, the adhesive layer 23 acts as a reinforcement. Therefore, occurrence of cracks in the chip 22-i when the thin chip 22-i is picked up can be greatly reduced. As a result, a chip with the thickness of 100 μm or less can be relatively easily formed. Further, since a chip which is less subject to backside chipping and is highly strong can be formed, occurrence of cracks at the bonding time can be reduced. In addition, the step of cutting the adhesive layer can be made unnecessary even if the dicing before grinding method is used and the operation can be less complicated.

In the above embodiment, a case wherein the three semiconductor chips (four chips including the spacer chip) are mounted in a stack form is explained as an example in order to clarify the explanation. However, if an upper-side chip which is smaller as in the case of the chips 22-1 and 22-2 or has substantially the same size is used, chips can be further stacked by interposing at least one spacer. With the present technology, seven or eight chips including spacer chips can be stacked.

A case where the dicing before grinding method is used is explained as an example, and in this case, the effect is significant. However, this invention can be applied to the normal manufacturing process in which a dicing step is performed after backside grinding.

According to the above configuration and manufacturing method, backside chipping can be suppressed, the bending strength can be enhanced even when a thin chip is used and occurrence of poor connection can be suppressed. Further, since the thin chips which have high bending strength are stacked to form a stack MCP, the thin structure or multi-stacked structure can be packaged.

In the manufacturing process of the stack MCP, the step of forming the semiconductor chips can be variously modified. Various modifications of the above step are explained below. The modifications are basically based on the dicing before grinding method and the semiconductor chip is reinforced by forming or attaching an adhesive layer or adhesive tape on or to the element forming surface of the semiconductor chip before backside grinding. The adhesive layer on the element forming surface is used in the step of mounting an upper-stage chip.

[Modification 1]

Figure 6:
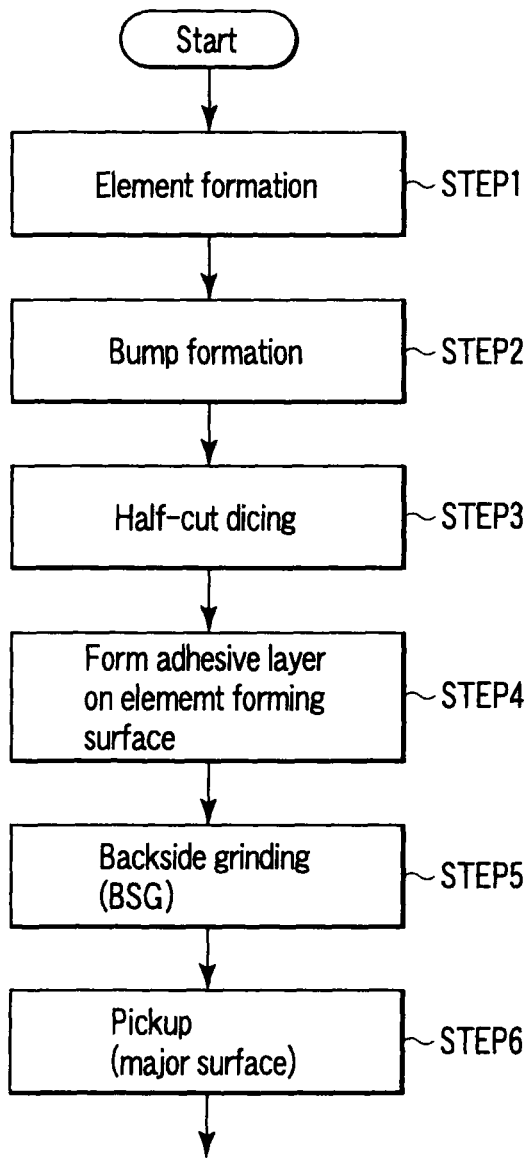
FIG. 6 is a manufacturing process diagram for illustrating a modification 1 of the manufacturing method of the semiconductor device according to the embodiment of this invention.

As shown in FIG. 6, first, various elements are formed on a semiconductor wafer 22 by use of a known process (STEP1). Then, bumps 25 are formed on the element forming surface of the wafer 22 on which elements have already been formed (STEP2). In a case where stud bumps are formed, bumps 25 electrically connected to the elements are formed by use of a capillary 32 as described before. After this, grooves 33 having a depth which does not reach the backside of the wafer are formed along dicing lines or chip dividing lines of the wafer 22 starting from the element forming surface by use of a diamond scriber, diamond blade, laser scriber or the like. Thus, a so-called half-cut dicing process is performed (STEP3). Next, an adhesive sheet having an adhesive layer formed on a sheet-form base member is attached to the element forming surface of the wafer 22 to cover the bumps 25 with the adhesive layer 23 (STEP4). After this, the backside of the wafer 22 is ground by use of a grindstone 35 (STEP5). Thus, the process for reducing the thickness of the wafer 22 and the process for dividing the wafer into individual chips 22-i are simultaneously performed (dicing before grinding). After the end of grinding, the individually divided chips 22-i are mounted on a fixing table of a pickup device and the fixing table is moved in an XY direction so as to set the pickup tool to correspond to the chip 22-i which is to be next picked up. Then, a pin holder 38 having thrust pins 37 mounted thereon is moved up to project the thrust pins 37 from the upper surface of the backup holder 36 while the space inside a backup holder 36 of the pickup device is evacuated. As a result, the chip 22-i is pushed up in an arrow direction from the adhesive layer side, the backside of the chip 22-i is chucked by use of a collet and the chip is completely taken off and picked up (STEP6). At this time, the adhesive layer of the adhesive tape is separated from the base member and is left behind on the element forming surface of the chip 22-i.

After the semiconductor chips 22-1, 22-2, 22-3 are thus formed, the chips 22-1, 22-2, 22-3 (including the spacer 28) are mounted on the printed circuit board 21 and packaged according to the procedure shown in FIG. 5.

[Modification 2]

Figure 7:
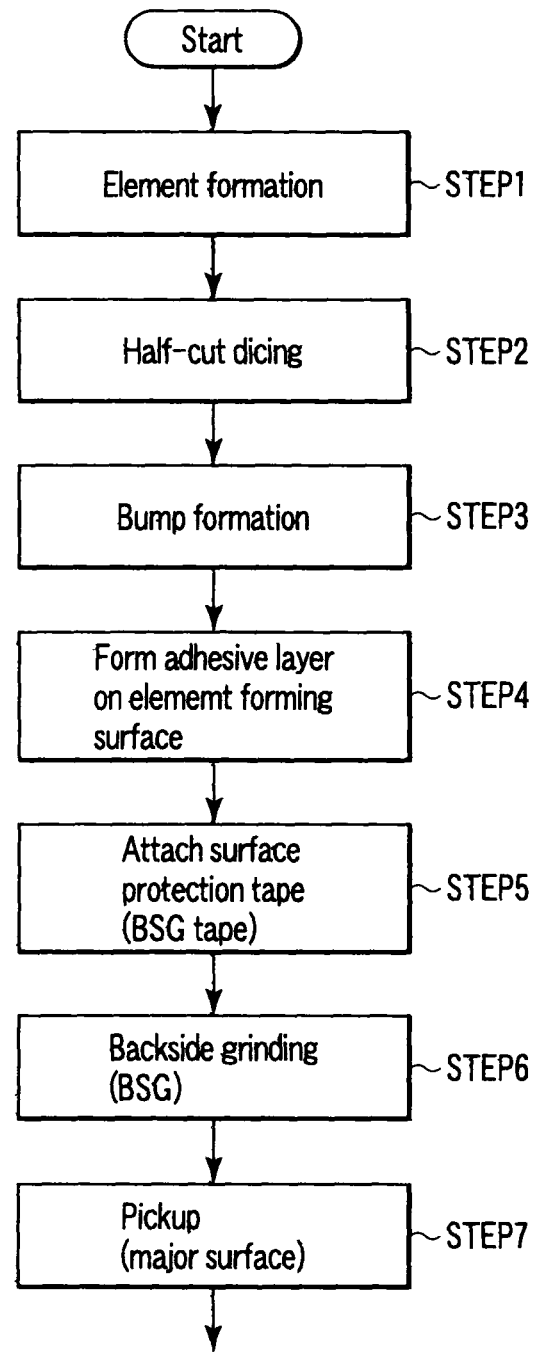
FIG. 7 is a manufacturing process diagram for illustrating a modification 2 of the manufacturing method of the semiconductor device according to the embodiment of this invention.

As shown in FIG. 7, first, various elements are formed on a semiconductor wafer 22 by use of a known process (STEP1). Then, grooves 33 having a depth which does not reach the backside of the wafer are formed along dicing lines or chip dividing lines of the wafer 22 starting from the element forming surface by use of a diamond scriber, diamond blade, laser scriber or the like. Thus, a so-called half-cut dicing process is performed (STEP2). After this, bumps 25 are formed on the element forming surface of the wafer 22 on which elements have already been formed (STEP3). If stud bumps are formed, bumps 25 electrically connected to the elements are formed by use of a capillary 32 as described before. Next, a film-form adhesive agent is attached to the element forming surface of the wafer 22 to form an adhesive layer 23 (STEP4). After this, the adhesive layer 23 is heated as required to expose the bumps 25 from the surface of the adhesive layer 23. The adhesive layer 23 can also be formed by using a liquid-form adhesive agent and coating the adhesive agent by spin coating to cover the wafer except the upper portions of the bumps 25. Then, a surface protection tape (BSG tape) is attached to the adhesive layer 23 on the backside of the wafer 22 (STEP5). The backside of the wafer 22 is ground by use of a grindstone 35 (STEP6). Thus, the process for reducing the thickness of the wafer 22 and the process for dividing the wafer into individual chips 22-*i* are simultaneously performed (dicing before grinding). After the end of grinding, the individually divided chips 22-*i* are mounted on a fixing table of a pickup device and the fixing table is moved in the XY direction so as to set the pickup tool to correspond to the chip 22-*i* which is to be next picked up. Then, the space inside a backup holder 36 of the pickup device is evacuated to fixedly chuck the surface protection tape 34 onto the upper surface of the backup holder 36. In this state, a pin holder 38 having thrust pins 37 mounted thereon is moved up to project the thrust pins 37 from the upper surface of the backup holder 36. As a result, the chip 22-*i* is pushed up in an arrow direction from the adhesive layer 23 side with the surface protection tape 34 disposed therebetween so as to separate the corner portions of the chip 22-*i* from the surface protection tape 34. Further, the backside of the chip 22-*i* is chucked by use of a collet and the chip is completely separated and picked up (STEP7). At this time, the adhesive layer 23 (23-*i*) is torn off and cut off in a position corresponding to the groove 33.

After the semiconductor chips 22-1, 22-2, 22-3 are thus formed, the process for mounting the chips 22-1, 22-2, 22-3 (including the spacer 28) on the printed circuit board 21 and packaging them is performed according to the procedure as shown in FIG. 5.

[Modification 3]

Figure 8:
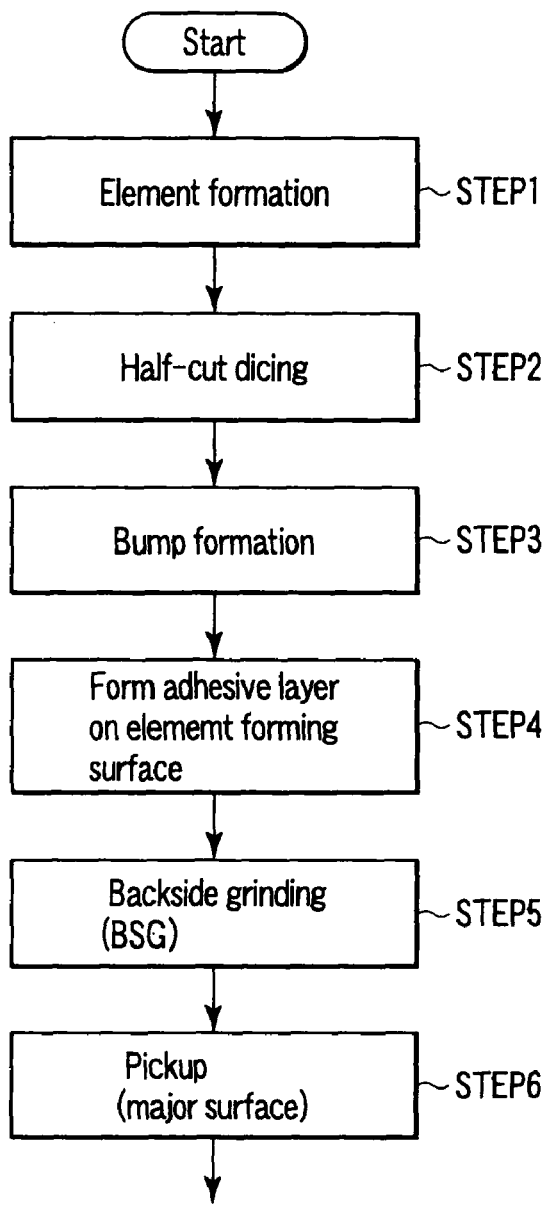
FIG. 8 is a manufacturing process diagram for illustrating a modification 3 of the manufacturing method of the semiconductor device according to the embodiment of this invention.

As shown in FIG. 8, first, various elements are formed on a semiconductor wafer 22 by use of a known process (STEP1). Then, grooves 33 having a depth which does not reach the backside of the wafer are formed along dicing lines or chip dividing lines of the wafer 22 starting from the element forming surface by use of a diamond scriber, diamond blade, laser scriber or the like. Thus, a so-called half-cut dicing process is performed (STEP2). After this, bumps 25 are formed on the element forming surface of the wafer 22 on which elements have already been formed (STEP3). If stud bumps are formed, bumps 25 electrically connected to the elements are formed by use of a capillary 32 as described before. Next, an adhesive layer 23 is formed to cover the bumps 25 by attaching an adhesive sheet having an adhesive layer formed on a sheet-form base member to the element forming surface of the wafer 22 (STEP4). After this, the backside of the wafer 22 is ground by use of a grindstone 35 (STEP5). Thus, the process for reducing the thickness of the wafer 22 and the process for dividing the wafer into individual chips 22-*i* are simultaneously performed (dicing before grinding). After the end of grinding, the individually divided chips 22-*i* are mounted on a fixing table of a pickup device and the fixing table is moved in the XY direction so as to set the pickup tool to correspond to the chip 22-*i* which is to be next picked up. Then, the space inside a backup holder 36 of the pickup device is evacuated to chuck and fix the adhesive tape onto the upper surface of the backup holder 36. In this state, a pin holder 38 having thrust pins 37 mounted thereon is moved up to project the thrust pins 37 from the upper surface of the backup holder 36. As a result, the chip 22-*i* is pushed up in an arrow direction from the adhesive layer side. Thus, the backside of the chip 22-*i* is chucked by use of a collet and the chip is separated and picked up (STEP6). At this time, the adhesive layer of the adhesive sheet is separated from the base member and left behind on the element forming surface of the chip 22-*i*.

After the semiconductor chips 22-1, 22-2, 22-3 are thus formed, the process for mounting the chips 22-1, 22-2, 22-3 (including the spacer 28) on the printed circuit board 21 and packaging them is performed according to the procedure as shown in FIG. 5.

[Modification 4]

Figure 9:
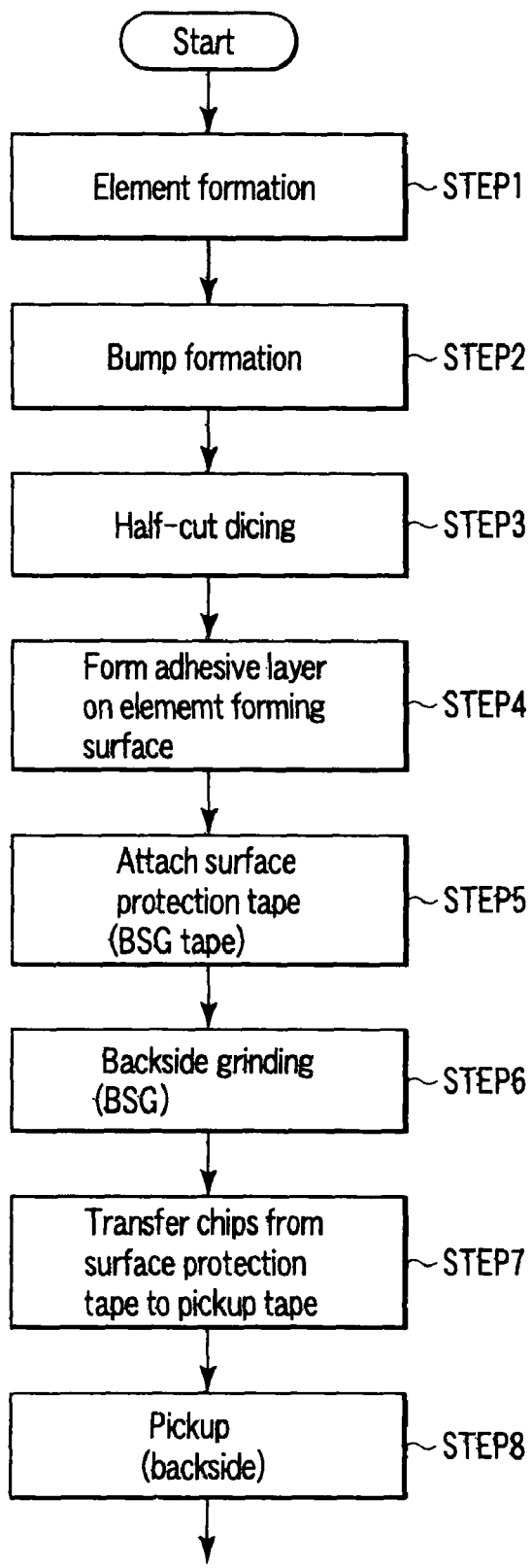
FIG. 9 is a manufacturing process diagram for illustrating a modification 4 of the manufacturing method of the semiconductor device according to the embodiment of this invention.

As shown in FIG. 9, first, various elements are formed on a semiconductor wafer 22 by use of a known process (STEP1). Then, bumps 25 are formed on the element forming surface of the wafer 22 on which elements have already been formed (STEP2). If stud bumps are formed, bumps 25 electrically connected to the elements are formed by use of a capillary 32 as described before. After this, grooves 33 having a depth which does not reach the backside of the wafer are formed along dicing lines or chip dividing lines of the wafer 22 starting from the element forming surface by use of a diamond scriber, diamond blade, laser scriber or the like. Thus, a so-called-half-cut dicing process is performed (STEP3). Next, a film-like adhesive agent is attached to the element forming surface of the wafer 22 to form an adhesive layer 23 (STEP4). Then, the adhesive layer 23 is heated as required to expose the bumps 25 from the surface of the adhesive layer 23. The adhesive layer 23 can also be formed by using a liquid-form adhesive agent and spin-coating the adhesive agent to cover the wafer except the upper portions of the bumps 25. After this, a surface protection tape (BSG tape) 34 is attached to the adhesive layer 23 formed on the element forming surface of the wafer 22 (STEP5) and the backside of the wafer 22 is ground by use of a grindstone 35 (STEP6). Thus, the process for reducing the thickness of the wafer 22 and the process for dividing the wafer into individual chips 22-*i* are simultaneously performed (dicing before grinding). After the end of grinding, the backside of each of the chips 22-*i* individually divided in the above process is positioned on and adhered to a pickup tape mounted on a flat ring (wafer ring) and then the surface protection tape 34 is separated. As a result, the individual chips 22-*i* are transferred from the surface protection tape to the pickup tape (STEP7). Next, the flat ring is mounted on a fixing table of a pickup device and the fixing table is moved in the XY direction so as to set the pickup tool to correspond to the chip 22-*i* which is to be next picked up. After this, the process for monitoring the surface of each of the chips 22-*i* is performed so as to detect the position of each of the individual chips 22-*i* and detect a mark which is used to determine whether the chip is of good or poor quality. Then, the space inside a backup holder 36 of the pickup device is evacuated to chuck and fix the pickup tape onto the upper surface of the backup holder 36. In this state, a pin holder 38 having thrust pins 37 mounted thereon is moved up to project the thrust pins 37 from the upper surface of the backup holder 36. As a result, the chip 22-*i* is pushed up in an arrow direction from the backside with the pickup tape disposed therebetween so as to separate the corner portions of the chip 22-*i* from the pickup tape. Thus, the element forming surface of the chip 22-*i* is chucked by use of a collet and the chip is separated and picked up (STEP8). At this time, the adhesive layer 23 is torn off and cut off in a position corresponding to the groove 33.

After the semiconductor chips 22-1, 22-2, 22-3 are thus formed, the process for mounting the chips 22-1, 22-2, 22-3 (including the spacer 28) on the printed circuit board 21 and packaging them is performed according to the procedure as shown in FIG. 5.

[Modification 5]

Figure 10:
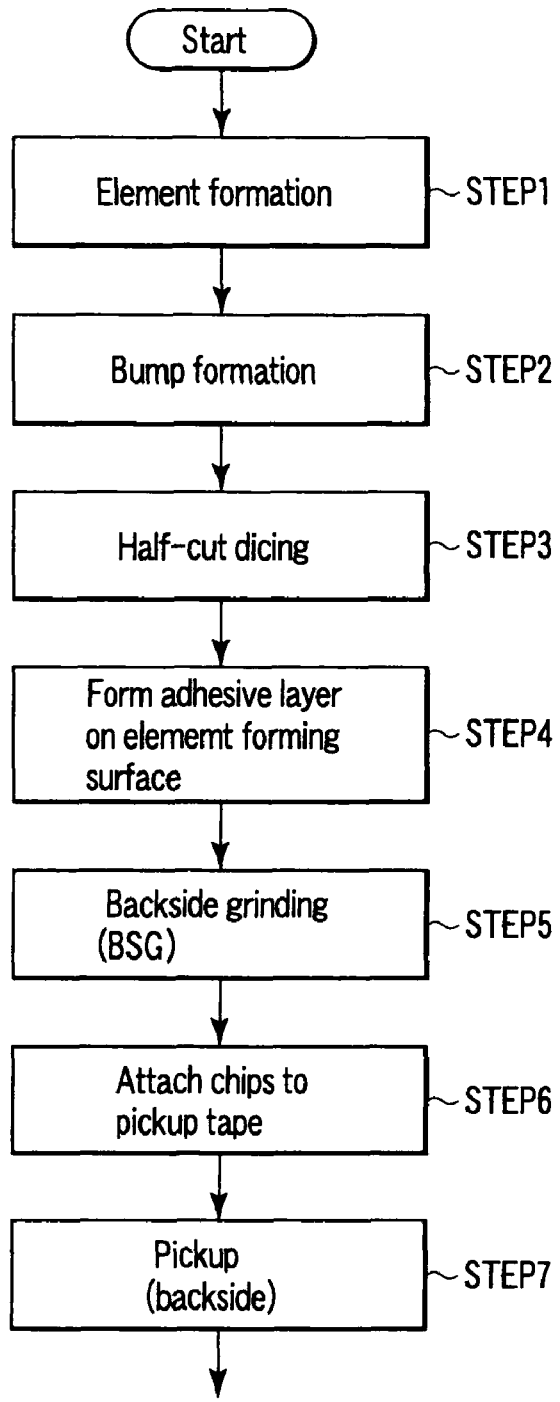
FIG. 10 is a manufacturing process diagram for illustrating a modification 5 of the manufacturing method of the semiconductor device according to the embodiment of this invention.

As shown in FIG. 10, first, various elements are formed on a semiconductor wafer 22 by use of a known process (STEP1). Then, bumps 25 are formed on the element forming surface of the wafer 22 on which elements have already been formed (STEP2). If stud bumps are formed, bumps 25 electrically connected to the elements are formed by use of a capillary 32 as described before. After this, grooves 33 having a depth which does not reach the backside of the wafer are formed along dicing lines or chip dividing lines of the wafer 22 starting from the element forming surface by use of a diamond scriber, diamond blade, laser scriber or the like. Thus, a so-called half-cut dicing process is performed (STEP3). Next, a film-like adhesive agent is attached to the element forming surface of the wafer 22 to form an adhesive layer 23 (STEP4). Then, the adhesive layer 23 is heated as required to expose the bumps 25 from the surface of the adhesive layer 23. The adhesive layer 23 can also be formed by using a liquid-form adhesive agent and spin-coating the adhesive agent to cover the wafer except the upper portions of the bumps 25. After this, the backside of the wafer 22 is ground by use of a grindstone 35 (STEP5). Thus, the process for reducing the thickness of the wafer 22 and the process for dividing the wafer into individual chips 22-i are simultaneously performed (dicing before grinding). After the end of grinding, the backside of each of the individually divided chips 22-i is positioned on and adhered to a pickup tape mounted on a flat ring (STEP6). Then, the flat ring is mounted on a fixing table of a pickup device and the fixing table is moved in the XY direction so as to set the pickup tool to correspond to the chip 22-i which is to be next picked up. After this, the process for monitoring the surface of each of the chips 22-i is performed so as to detect the position of each of the individual chips 22-i and detect a mark which is used to determine whether the chip is of good or poor quality. Then, the space inside a backup holder 36 of the pickup device is evacuated to chuck and fix the pickup tape on the upper surface of the backup holder 36. In this state, a pin holder 38 having thrust pins 37 mounted thereon is moved up to project the thrust pins 37 from the upper surface of the backup holder 36. As a result, the chip is pushed up in an arrow direction from the backside with the pickup tape disposed therebetween so as to separate the corner portions of the chip 22-i from the pickup tape. Thus, the element forming surface of the chip 22-i is chucked by use of a collet and the chip is separated and picked up (STEP7). At this time, the adhesive layer 23 is torn off and cut off in a position corresponding to the groove 33.

After the semiconductor chips 22-1, 22-2, 22-3 are thus formed, the process for mounting the chips 22-1, 22-2, 22-3 (including the spacer 28) on the printed circuit board 21 and packaging them is performed according to the procedure as shown in FIG. 5.

[Modification 6]

Figure 11:
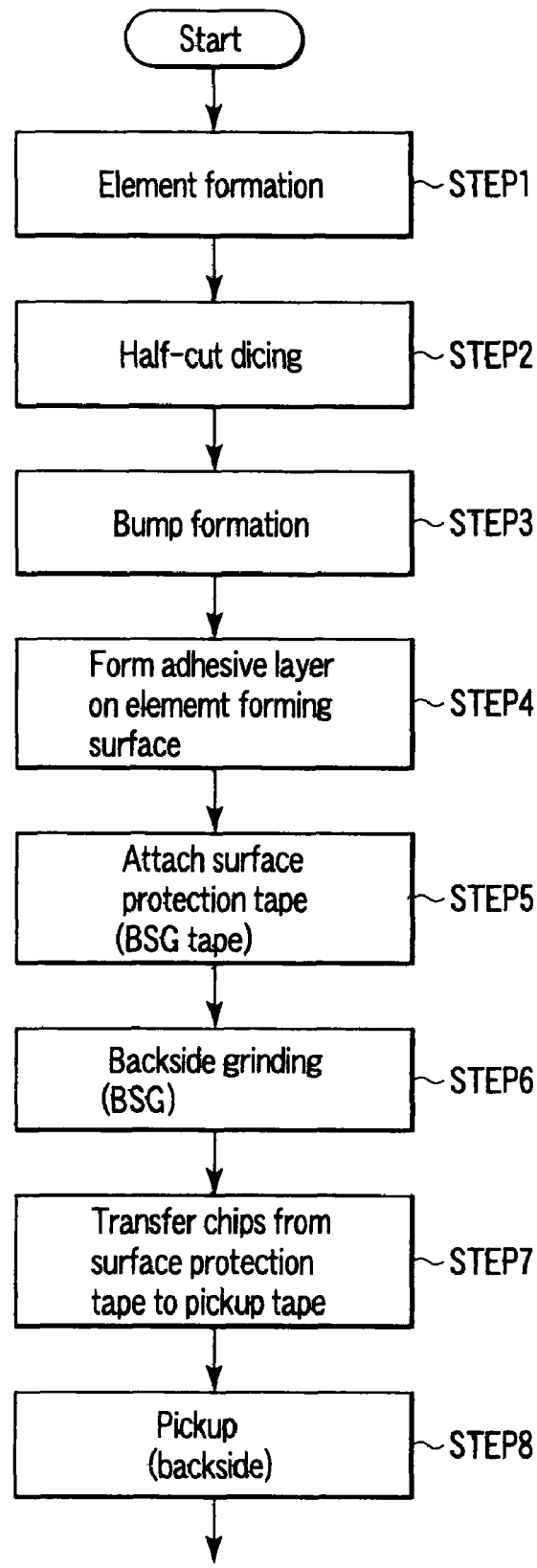
FIG. 11 is a manufacturing process diagram for illustrating a modification 6 of the manufacturing method of the semiconductor device according to the embodiment of this invention.

As shown in FIG. 11, first, various elements are formed on a semiconductor wafer 22 by use of a known process (STEP1). Then, grooves 33 having a depth which does not reach the backside of the wafer are formed along dicing lines or chip dividing lines of the wafer 22 starting from the element forming surface by use of a diamond scriber, diamond blade, laser scriber or the like. Thus, a so-called half-cut dicing process is performed (STEP2). After this, bumps 25 are formed on the element forming surface of the wafer 22 on which the grooves 33 and elements have been formed (STEP3). If stud bumps are formed, bumps 25 electrically connected to the elements are formed by use of a capillary 32 as described before. Next, a film-like adhesive agent is attached to the element forming surface of the wafer 22 to form an adhesive layer 23 (STEP4). Then, the adhesive layer 23 is heated as required to expose the bumps 25 from the surface of the adhesive layer 23. The adhesive layer 23 can also be formed by using a liquid-form adhesive agent and spin-coating the adhesive agent to cover the wafer except the upper portions of the bumps 25. After this, a surface protection tape (BSG tape) 34 is attached to the adhesive layer 23 (STEP5) and the backside of the wafer 22 is ground by use of a grindstone 35 (STEP6). Thus, the process for reducing the thickness of the wafer 22 and the process for dividing the wafer into individual chips 22-i are simultaneously performed (dicing before grinding). After the end of grinding, the backside of each of the individually divided chips 22-i is positioned on and adhered to a pickup tape mounted on a flat ring and then the surface protection tape is separated. Thus, the chips 22-i are transferred from the surface protection tape 34 to the pickup tape (STEP7). Next, the flat ring is mounted on a fixing table of a pickup device and the fixing table is moved in the XY direction so as to set the pickup tool to correspond to the chip 22-i which is to be next picked up. After this, the process for monitoring the surface of each of the chips 22-i is performed so as to detect the position of each of the individual chips 22-i and detect a mark which is used to determine whether the chip is of good or poor quality. Then, the space inside a backup holder 36 of the pickup device is evacuated to chuck and fix the pickup tape on the upper surface of the backup holder 36. In this state, a pin holder 38 having thrust pins 37 mounted thereon is moved up to project the thrust pins 37 from the upper surface of the backup holder 36. As a result, the chip is pushed up in an arrow direction from the backside with the pickup tape disposed therebetween so as to separate the corner portions of the chip 22-i from the pickup tape. Thus, the element forming surface of the chip 22-i is chucked by use of a collet and the chip is separated and picked up (STEP8). At this time, the adhesive layer 23 is torn off and cut off in a position corresponding to the groove 33.

After the semiconductor chips 22-1, 22-2, 22-3 are thus formed, the process for mounting the chips 22-1, 22-2, 22-3 (including the spacer 28) on the printed circuit board 21 and packaging them is performed according to the procedure as shown in FIG. 5.

[Modification 7]

As shown in FIG. 12, first, various elements are formed on a semiconductor wafer 22 by use of a known process (STEP1). Then, grooves 33 having a depth which does not reach the backside of the wafer are formed along dicing lines or chip dividing lines of the wafer 22 starting from the element forming surface by use of a diamond scriber, diamond blade, laser scriber or the like. Thus, a so-called half-cut dicing process is performed (STEP2). After this, bumps 25 are formed on the element forming surface of the wafer 22 on which the grooves 33 and elements have been formed (STEP3). If stud bumps are formed, bumps 25 electrically connected to the elements are formed by use of a capillary 32 as described before. Next, a film-like adhesive agent is attached to the element forming surface of the wafer 22 to form an adhesive layer 23 (STEP4). Then, the adhesive layer 23 is heated as required to expose the bumps 25 from the surface of the adhesive layer 23. The adhesive layer 23 can also be formed by using a liquid-form adhesive agent and spin-coating the adhesive agent to cover the wafer except the upper portions of the bumps 25. After this, the backside of the wafer 22 is ground by use of a grindstone 35 (STEP5). Thus, the process for reducing the thickness of the wafer 22 and the process for dividing the wafer into individual chips 22-i are simultaneously performed (dicing before grinding). After the end of grinding, the backside of each of the individually divided chips 22-i is positioned on and adhered to a pickup tape mounted on a flat ring. Thus, the chips 22-i are transferred to the pickup tape (STEP6). Next, the flat ring is mounted on a fixing table of a pickup device and the fixing table is moved in the XY direction so as to set the pickup tool to correspond to the chip 22-*i* which is to be next picked up. After this, the process for monitoring the surface of each of the chips 22-*i* is performed so as to detect the position of each of the individual chips 22-*i* and detect a mark which is used to determine whether the chip is of good or poor quality. Then, the space inside a backup holder 36 of the pickup device is evacuated to chuck and fix the pickup tape on the upper surface of the backup holder 36. In this state, a pin holder 38 having thrust pins 37 mounted thereon is moved up to project the thrust pins 37 from the upper surface of the backup holder 36. As a result, the chip is pushed up in an arrow direction from the backside with the pickup tape disposed therebetween so as to separate the corner portions of the chip 22-*i* from the pickup tape. Thus, the element forming surface of the chip 22-*i* is chucked by use of a collet and the chip is separated and picked up (STEP7). At this time, the adhesive layer 23 is torn off and cut off in a position corresponding to the groove 33.

After the semiconductor chips 22-1, 22-2, 22-3 are thus formed, the process for mounting the chips 22-1, 22-2, 22-3 (including the spacer 28) on the printed circuit board 21 and packaging them is performed according to the procedure as shown in FIG. 5.

[Modification 8]

As shown in FIG. 13, first, various elements are formed on a semiconductor wafer 22 by use of a known process (STEP1). Then, bumps 25 are formed on the element forming surface of the wafer 22 on which elements have already been formed (STEP2). If stud bumps are formed, bumps 25 electrically connected to the elements are formed by use of a capillary 32 as described before. After this, grooves 33 having a depth which does not reach the backside of the wafer are formed along dicing lines or chip dividing lines of the wafer 22 starting from the element forming surface by use of a diamond scriber, diamond blade, laser scriber or the like. Thus, a so-called half-cut dicing process is performed (STEP3). Next, a film-like adhesive agent is attached to the element forming surface of the wafer 22 to form an adhesive layer 23 (STEP4). Then, the adhesive layer 23 is heated as required to expose the bumps 25 from the surface of the adhesive layer 23. The adhesive layer 23 can also be formed by using a liquid-form adhesive agent and spin-coating the adhesive agent to cover the wafer except the upper portions of the bumps 25. After this, a surface protection tape (BSG tape) 34 is attached onto the adhesive layer 23 (STEP5) and the backside of the wafer 22 is ground by use of a grindstone 35 (STEP6). Thus, the process for reducing the thickness of the wafer 22 and the process for dividing the wafer into individual chips 22-*i* are simultaneously performed (dicing before grinding). After the end of grinding, the backside of each of the individually divided chips 22-*i* is positioned on and adhered to an ultraviolet (UV) curing type pickup tape mounted on a flat ring and the surface protection tape 34 is separated. Thus, the chips 22-*i* are transferred from the surface protection tape 34 to the pickup tape (STEP7). After this, ultraviolet rays are applied to the pickup tape from a light source 16 to cure the same and lower the viscosity thereof (STEP8). Next, the flat ring is mounted on a fixing table of a pickup device and the fixing table is moved in the XY direction so as to set the pickup tool to correspond to the chip 22-*i* which is to be next picked up. Then, the process for monitoring the surface of each of the chips 22-*i* is performed so as to detect the position of each of the individual chips 22-*i* and detect a mark which is used to determine whether the chip is of good or poor quality. Then, the space inside a backup holder 36 of the pickup device is evacuated to chuck and fix the pickup tape on the upper surface of the backup holder 36. In this state, a pin holder 38 having thrust pins 37 mounted thereon is moved up to project the thrust pins 37 from the upper surface of the backup holder 36. As a result, the chip is pushed up in an arrow direction from the backside the pickup tape disposed therebetween so as to separate the corner portions of the chip 22-*i* from the pickup tape. Thus, the element forming surface of the chip 22-*i* is chucked by use of a collet and the chip is separated and picked up (STEP9). At this time, the adhesive layer 23 is torn off and cut off in a position corresponding to the groove 33.

After the semiconductor chips 22-1, 22-2, 22-3 are thus formed, the process for mounting the chips 22-1, 22-2, 22-3 (including the spacer 28) on the printed circuit board 21 and packaging them is performed according to the procedure as shown in FIG. 5.

[Modification 9]

As shown in FIG. 14, first, various elements are formed on a semiconductor wafer 22 by use of a known process (STEP1). Then, bumps 25 are formed on the element forming surface of the wafer 22 on which elements have already been formed (STEP2). If stud bumps are formed, bumps 25 electrically connected to the elements are formed by use of a capillary 32 as described before. After this, grooves 33 having a depth which does not reach the backside of the wafer are formed along dicing lines or chip dividing lines of the wafer 22 starting from the element forming surface by use of a diamond scriber, diamond blade, laser scriber or the like. Thus, a so-called half-cut dicing process is performed (STEP3). Next, a film-like adhesive agent is attached to the element forming surface of the wafer 22 to form an adhesive layer 23 (STEP4). Then, the adhesive layer 23 is heated as required to expose the bumps 25 from the surface of the adhesive layer 23. The adhesive layer 23 can also be formed by using a liquid-form adhesive agent and spin-coating the adhesive agent to cover the wafer except the upper portions of the bumps 25. After this, the backside of the wafer 22 is ground by use of a grindstone 35 (STEP5). Thus, the process for reducing the thickness of the wafer 22 and the process for dividing the wafer into individual chips 22-*i* are simultaneously performed (dicing before grinding). After the end of grinding, the backside of each of the individually divided chips 22-*i* is positioned on and adhered to an ultraviolet (UV) curing type pickup tape mounted on a flat ring. Thus, the chips 22-*i* are transferred to the pickup tape (STEP6). After this, ultraviolet rays are applied to the pickup tape to cure the same and lower the viscosity thereof (STEP7). Next, the flat ring is mounted on a fixing table of a pickup device and the fixing table is moved in the XY direction so as to set the pickup tool to correspond to the chip 22-*i* which is to be next picked up. Then, the process for monitoring the surface of each of the chips 22-*i* is performed so as to detect the position of each of the individual chips 22-*i* and detect a mark which is used to determine whether the chip is of good or poor quality. Then, the space inside a backup holder 36 of the pickup device is evacuated to chuck and fix the pickup tape onto the upper surface of the backup holder 36. In this state, a pin holder 38 having thrust pins 37 mounted thereon is moved up to project the thrust pins 37 from the upper surface of the backup holder 36. As a result, the chip is pushed up in an arrow direction from the backside with the pickup tape disposed therebetween so as to separate the corner portions of the chip 22-*i* from the pickup tape. Thus, the element forming surface of the chip 22-*i* is chucked by use of a collet and the chip is separated and picked up (STEP8). At this time, the adhesive layer 23 is torn off and cut off in a position corresponding to the groove 33.

After the semiconductor chips 22-1, 22-2, 22-3 are thus formed, the process for mounting the chips 22-1, 22-2, 22-3 (including the spacer 28) on the printed circuit board 21 and packaging them is performed according to the procedure as shown in FIG. 5.

[Modification 10]

As shown in FIG. 15, first, various elements are formed on a semiconductor wafer 22 by use of a known process (STEP1). Then, grooves 33 having a depth which does not reach the backside of the wafer are formed along dicing lines or chip dividing lines of the wafer 22 starting from the element forming surface by use of a diamond scriber, diamond blade, laser scriber or the like. Thus, a so-called half-cut dicing process is performed (STEP2). After this, bumps 25 are formed on the element forming surface of the wafer 22 on which the grooves 33 and elements have been formed (STEP3). If stud bumps are formed, bumps 25 electrically connected to the elements are formed by use of a capillary 32 as described before. Next, a film-like adhesive agent is attached to the element forming surface of the wafer 22 to form an adhesive layer 23 (STEP4). Then, the adhesive layer 23 is heated as required to expose the bumps 25 from the surface of the adhesive layer 23. The adhesive layer 23 can also be formed by using a liquid-form adhesive agent and spin-coating the adhesive agent to cover the wafer except the upper portions of the bumps 25. After this, a surface protection tape (BSG tape) 34 is attached onto the adhesive layer 23 (STEP5) and the backside of the wafer 22 is ground by use of a grindstone 35 (STEP6). Thus, the process for reducing the thickness of the wafer 22 and the process for dividing the wafer into individual chips **22-*i* are simultaneously performed (dicing before grinding). After the end of grinding, the backside of each of the individually divided chips 22-*i* is positioned on and adhered to an ultraviolet (UV) curing type pickup tape mounted on a flat ring and then the surface protection tape 34 is separated. Thus, the chips 22-*i* are transferred from the surface protection tape 34 to the pickup tape (STEP7). After this, ultraviolet rays are applied to the pickup tape from a light source 16 to cure the same and lower the viscosity thereof (STEP8). Next, the flat ring is mounted on a fixing table of a pickup device and the fixing table is moved in the XY direction so as to set the pickup tool to correspond to the chip 22-*i* which is to be next picked up. Then, the process for monitoring the surface of each of the chips 22-*i* is performed so as to detect the position of each of the individual chips 22-*i* and detect a mark which is used to determine whether the chip is of good or poor quality. Further, the space inside a backup holder 36 of the pickup device is evacuated to chuck and fix the pickup tape on the upper surface of the backup holder 36. In this state, a pin holder 38 having thrust pins 37 mounted thereon is moved up to project the thrust pins 37 from the upper surface of the backup holder 36. As a result, the chip is pushed up in an arrow direction from the backside with the pickup tape disposed therebetween so as to separate the corner portions of the chip 22-*i* from the pickup tape. Thus, the element forming surface of the chip 22-*i* is chucked by use of a collet and the chip is separated and picked up (STEP9). At this time, the adhesive layer 23 is torn off and cut off in a position corresponding to the groove 33**.

After the semiconductor chips 22-1, 22-2, 22-3 are thus formed, the process for mounting the chips 22-1, 22-2, 22-3 (including the spacer 28) on the printed circuit board 21 and packaging them is performed according to the procedure as shown in FIG. 5.

[Modification 11]

Figures 16, 17:
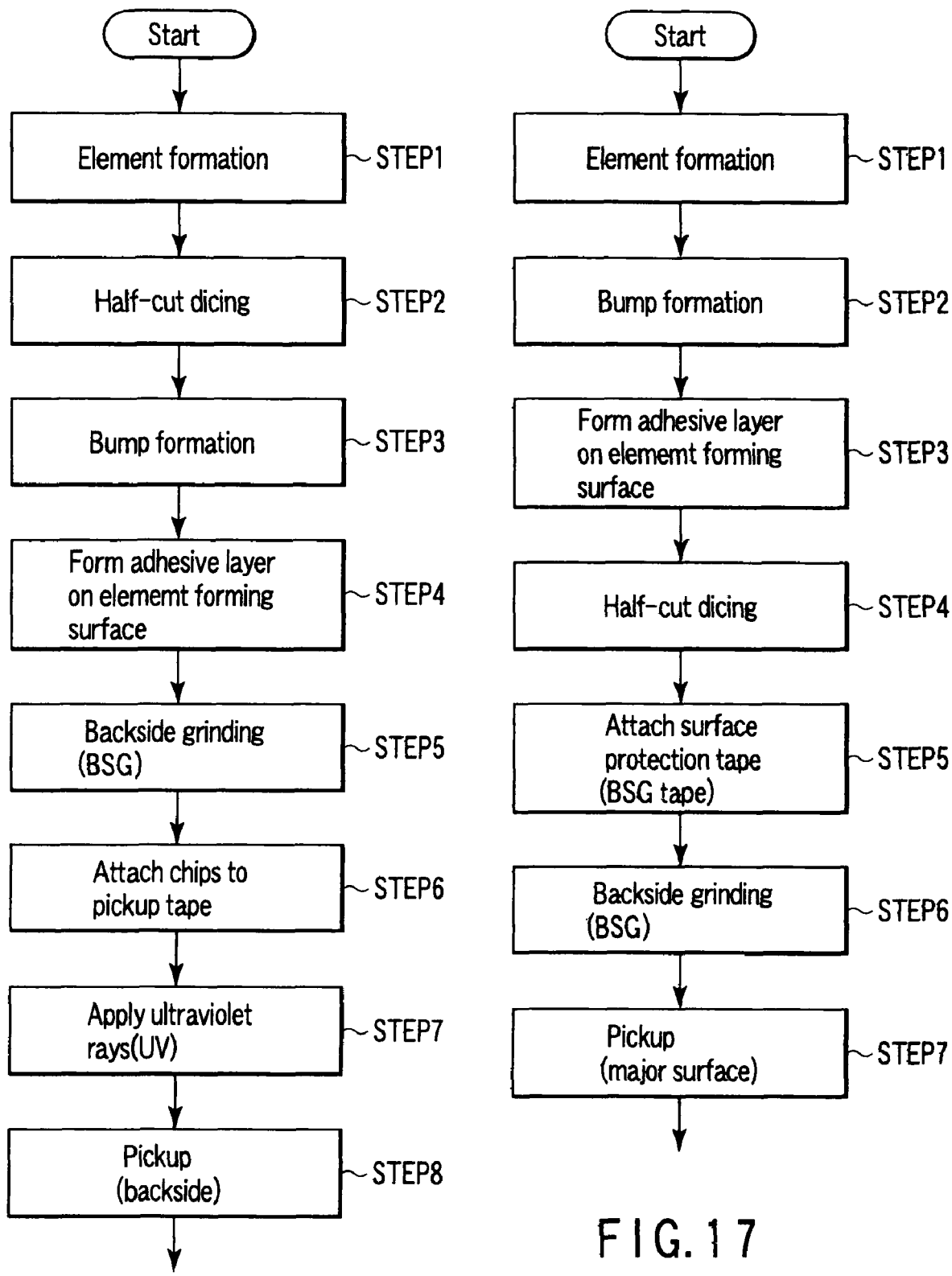
FIG. 16 is a manufacturing process diagram for illustrating a modification 11 of the manufacturing method of the semiconductor device according to the embodiment of this invention.
FIG. 17 is a manufacturing process diagram for illustrating a modification 12 of the manufacturing method of the semiconductor device according to the embodiment of this invention.

As shown in FIG. 16, first, various elements are formed on a semiconductor wafer 22 by use of a known process (STEP1). Then, grooves 33 having a depth which does not reach the backside of the wafer are formed along dicing lines or chip dividing lines of the wafer 22 starting from the element forming surface by use of a diamond scriber, diamond blade, laser scriber or the like. Thus, a so-called half-cut dicing process is performed (STEP2). After this, bumps 25 are formed on the element forming surface of the wafer 22 on which the grooves and elements have been formed (STEP3). If stud bumps are formed, bumps 25 electrically connected to the elements are formed by use of a capillary 32 as described before. Next, a film-like adhesive agent is attached to the element forming surface of the wafer 22 to form an adhesive layer 23 (STEP4). Then, the adhesive layer 23 is heated as required to expose the bumps 25 from the surface of the adhesive layer 23. The adhesive layer 23 can also be formed by using a liquid-form adhesive agent and spin-coating the adhesive agent to cover the wafer except the upper portions of the bumps 25. After this, the backside of the wafer 22 is ground by use of a grindstone 35 (STEP5). Thus, the process for reducing the thickness of the wafer 22 and the process for dividing the wafer into individual chips **22-*i* are simultaneously performed (dicing before grinding). After the end of grinding, the backside of each of the individually divided chips 22-*i* is positioned on and adhered to an ultraviolet (UV) curing type pickup tape mounted on a flat ring (STEP6). After this, ultraviolet rays are applied to the pickup tape from a light source 16 to cure the same and lower the viscosity thereof (STEP7). Next, the flat ring is mounted on a fixing table of a pickup device and the fixing table is moved in the XY direction so as to set the pickup tool to correspond to the chip 22-*i* which is to be next picked up. Then, the process for monitoring the surface of each of the chips 22-*i* is performed so as to detect the position of each of the individual chips 22-*i* and detect a mark which is used to determine whether the chip is of good or poor quality. Further, the space inside a backup holder 36 of the pickup device is evacuated to chuck and fix the pickup tape on the upper surface of the backup holder 36. In this state, a pin holder 38 having thrust pins 37 mounted thereon is moved up to project the thrust pins 37 from the upper surface of the backup holder 36. As a result, the chip is pushed up in an arrow direction from the backside with the pickup tape disposed therebetween so as to separate the corner portions of the chip 22-*i* from the pickup tape. Thus, the element forming surface of the chip 22-*i* is chucked by use of a collet and the chip is separated and picked up (STEP8). At this time, the adhesive layer 23 is torn off and cut off in a position corresponding to the groove 33**.

After the semiconductor chips 22-1, 22-2, 22-3 are thus formed, the process for mounting the chips 22-1, 22-2, 22-3 (including the spacer 28) on the printed circuit board 21 and packaging them is performed according to the procedure as shown in FIG. 5.

[Modification 12]

As shown in FIG. 17, first, various elements are formed on a semiconductor wafer 22 by use of a known process (STEP1). Then, bumps 25 are formed on the element forming surface of the wafer 22 on which elements have already been formed (STEP2). If stud bumps are formed, bumps 25 electrically connected to the element are formed by use of a capillary 32 as described before. After this, a film-like adhesive agent is attached to the element forming surface of the wafer 22 to form an adhesive layer 23 (STEP3). Then, the adhesive layer 23 is heated as required to expose the bumps 25 from the surface of the adhesive layer 23. The adhesive layer 23 can also be formed by using a liquid-form adhesive agent and spin-coating the adhesive agent to cover the wafer except the upper portions of the bumps 25. In this state, the adhesive layer 23 is cut and grooves 33 having a depth which does not reach the backside of the wafer are formed along dicing lines or chip dividing lines of the wafer 22 by use of a diamond scriber, diamond blade, laser scriber or the like. Thus, a so-called half-cut dicing process is performed (STEP4). After this, a surface protection tape (BSG tape) 34 is attached onto the adhesive layer 23 (STEP5) and the backside of the wafer 22 is ground by use of a grindstone 35 (STEP6). Thus, the process for reducing the thickness of the wafer 22 and the process for dividing the wafer into individual chips 22-$i$ are simultaneously performed (dicing before grinding). After the end of grinding, the space inside a backup holder 36 of the pickup device is evacuated to chuck and fix the surface protection tape 34 on the upper surface of the backup holder 36. In this state, a pin holder 38 having thrust pins 37 mounted thereon is moved up to project the thrust pins 37 from the upper surface of the backup holder 36. As a result, the chip is pushed up in an arrow direction from the adhesive layer 23 side with the surface protection tape 34 disposed therebetween so as to separate the corner portions of the chip 22-$i$ from the surface protection tape 34. Thus, the backside of the chip 22-$i$ is chucked by use of a collet and the chip is separated and picked up (STEP7). At this time, the adhesive layer 23 is torn off and cut off in a position corresponding to the groove 33.

After the semiconductor chips 22-1, 22-2, 22-3 are thus formed, the process for mounting the chips 22-1, 22-2, 22-3 (including the spacer 28) on the printed circuit board 21 and packaging them is performed according to the procedure as shown in FIG. 5.

[Modification 13]

Figures 18, 19:
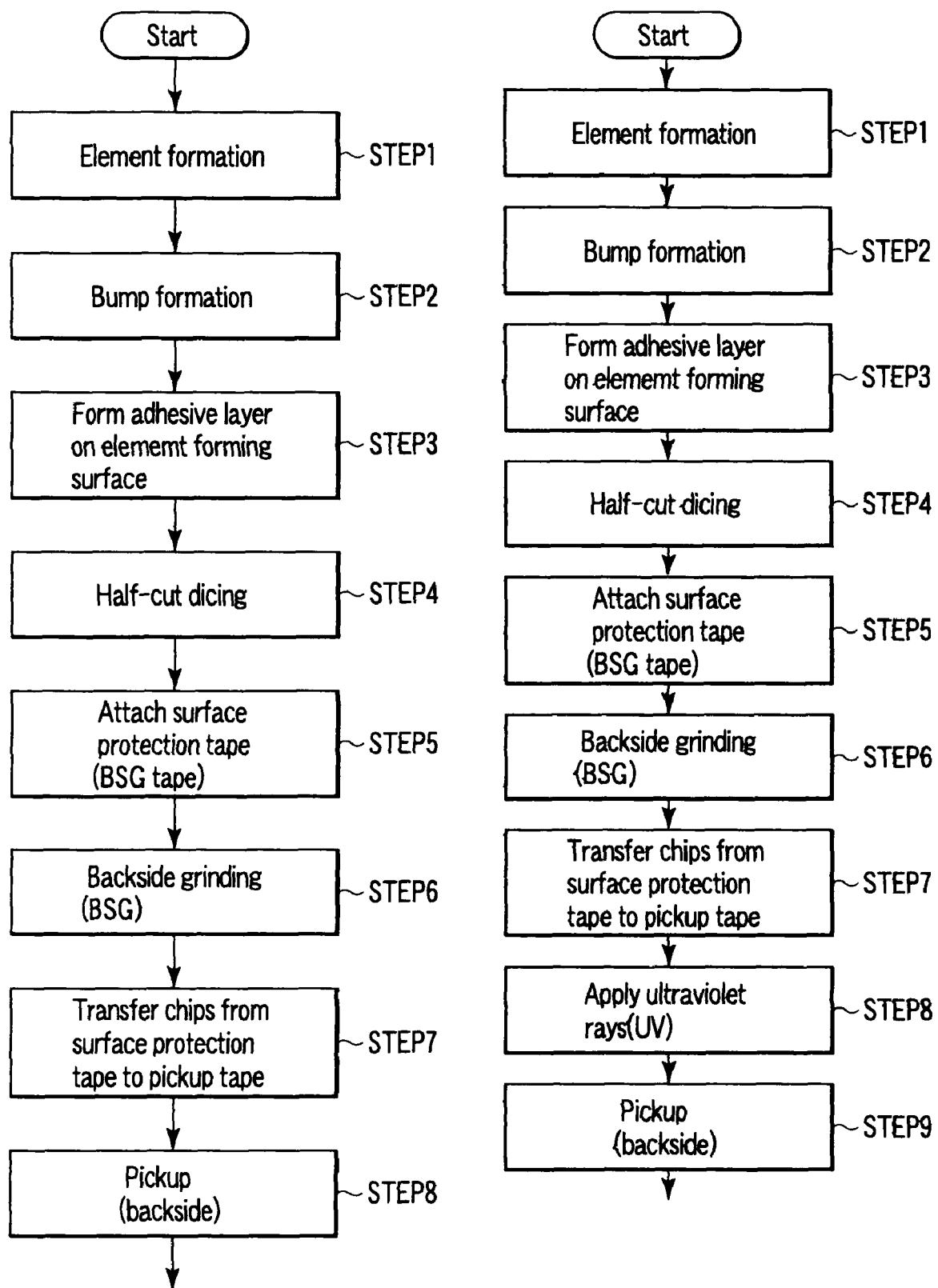
FIG. 18 is a manufacturing process diagram for illustrating a modification 13 of the manufacturing method of the semiconductor device according to the embodiment of this invention.
FIG. 19 is a manufacturing process diagram for illustrating a modification 14 of the manufacturing method of the semiconductor device according to the embodiment of this invention.

As shown in FIG. 18, first, various elements are formed on a semiconductor wafer 22 by use of a known process (STEP1). Then, bumps 25 are formed on the element forming surface of the wafer 22 on which elements have already been formed (STEP2). If stud bumps are formed, bumps 25 electrically connected to the elements are formed by use of a capillary 32 as described before. After this, a film-like adhesive agent is attached to the element forming surface of the wafer 22 to form an adhesive layer 23 (STEP3). Then, the adhesive layer 23 is heated as required to expose the bumps 25 from the surface of the adhesive layer 23. The adhesive layer 23 can also be formed by using a liquid-form adhesive agent and spin-coating the adhesive agent to cover the wafer except the upper portions of the bumps 25. In this state, the adhesive layer 23 is cut and grooves 33 having a depth which does not reach the backside of the wafer are formed along dicing lines or chip dividing lines of the wafer 22 by use of a diamond scriber, diamond blade, laser scriber or the like. Thus, a so-called half-cut dicing process is performed (STEP4). After this, a surface protection tape (BSG tape) 34 is attached onto the adhesive layer 23 (STEP5) and the backside of the wafer 22 is ground by use of a grindstone 35 (STEP6). Thus, the process for reducing the thickness of the wafer 22 and the process for dividing the wafer into individual chips 22-$i$ are simultaneously performed (dicing before grinding). After the end of grinding, each of the individually divided chips 22-$i$ is positioned on and adhered to a pickup tape mounted on a flat ring and the surface protection tape 34 is separated. As a result, the chips 22-$i$ are transferred from the surface protection tape 34 to the pickup tape (STEP7). Next, the flat ring is mounted on a fixing table of a pickup device and the fixing table is moved in the XY direction so as to set the pickup tool to correspond to the chip 22-$i$ which is to be next picked up. Then, the process for monitoring the surface of each of the chips 22-$i$ is performed so as to detect the position of each of the individual chips 22-$i$ and detect a mark which is used to determine whether the chip is of good or poor quality. After this, the space inside a backup holder 36 of the pickup device is evacuated to chuck and fix the pickup tape on the upper surface of the backup holder 36. In this state, a pin holder 38 having thrust pins 37 mounted thereon is moved up to project the thrust pins 37 from the upper surface of the backup holder 36. As a result, the chip is pushed up in an arrow direction from the backside with the pickup tape disposed therebetween so as to separate the corner portions of the chip 22-$i$ from the pickup tape. Thus, the element forming surface of the chip 22-$i$ is chucked by use of a collet and the chip is separated and picked up (STEP8). At this time, the adhesive layer 23 is torn off and cut off in a position corresponding to the groove 33.

After the semiconductor chips 22-1, 22-2, 22-3 are thus formed, the process for mounting the chips 22-1, 22-2, 22-3 (including the spacer 28) on the printed circuit board 21 and packaging them is performed according to the procedure as shown in FIG. 5.

[Modification 14]

As shown in FIG. 19, first, various elements are formed on a semiconductor wafer 22 by use of a known process (STEP1). Then, bumps 25 are formed on the element forming surface of the wafer 22 on which elements have already been formed (STEP2). If stud bumps are formed, bumps 25 electrically connected to the elements are formed by use of a capillary 32 as described before. After this, a film-like adhesive agent is attached to the element forming-surface of the wafer 22 to form an adhesive layer 23 (STEP3). Then, the adhesive layer 23 is heated as required to expose the bumps 25 from the surface of the adhesive layer 23. The adhesive layer 23 can also be formed by using a liquid-form adhesive agent and spin-coating the adhesive agent to cover the wafer except the upper portions of the bumps 25. In this state, the adhesive layer 23 is cut and grooves 33 having a depth which does not reach the backside of the wafer are formed along dicing lines or chip dividing lines starting from the element forming surface of the wafer 22 by use of a diamond scriber, diamond blade, laser scriber or the like. Thus, a so-called half-cut dicing process is performed (STEP4). After this, a surface protection tape (BSG tape) 34 is attached onto the adhesive layer 23 (STEP5) and the backside of the wafer 22 is ground by use of a grindstone 35 (STEP6). Thus, the process for reducing the thickness of the wafer 22 and the process for dividing the wafer into individual chips 22-$i$ are simultaneously performed (dicing before grinding). After the end of grinding, the backside of each of the individually divided chips 22-$i$ is positioned on and adhered to an ultraviolet (UV) curing type pickup tape mounted on a flat ring and then the surface protection tape 34 is separated. As a result, the chips 22-$i$ are transferred from the surface protection tape 34 to the pickup tape (STEP7). Then, ultraviolet rays are applied to the pickup tape to cure the same and lower the viscosity thereof (STEP8). Next, the flat ring is mounted on a fixing table of a pickup device and the fixing table is moved in the XY direction so as to set the pickup tool to correspond to the chip 22-$i$ which is to be next picked up. After this, the process for monitoring the surface of each of the chips 22-$i$ is performed so as to detect the position of each of the individual chips 22-$i$ and detect a mark which is used to determine whether the chip is of good or poor quality. Then, the space inside a backup holder 36 of the pickup device is evacuated to chuck and fix the pickup tape on the upper surface of the backup holder 36. In this state, a pin holder 38 having thrust pins 37 mounted thereon is moved up to project the thrust pins 37 from the upper surface of the backup holder 36. As a result, the chip is pushed up in an arrow direction from the backside with the pickup tape disposed therebetween so as to separate the corner portions of the chip 22-$i$ from the pickup tape. Thus, the element forming surface of the chip 22-$i$ is chucked by use of a collet and the chip is separated and picked up (STEP9). At this time, the adhesive layer 23 is torn off and cut off in a position corresponding to the groove 33.

After the semiconductor chips 22-1, 22-2, 22-3 are thus formed, the process for mounting the chips 22-1, 22-2, 22-3 (including the spacer 28) on the printed circuit board 21 and packaging them is performed according to the procedure as shown in FIG. 5.

[Modification 15]

An ultraviolet curing type tape can be used as the surface protection tape 34 in the above embodiment and modifications. Then, the process for picking up the chip can be easily performed by applying ultraviolet rays to the surface protection tape 34 and lowering the viscosity thereof after the wafer backside grinding process.

[Modification 16]

In the backside grinding (BSG) process in the above embodiment and modifications, a method called an in-feed grinding method for grinding the backside of the wafer 22 while a grinding grindstone and a chuck table used to fix the wafer 22 are being rotated and the grindstone is being lowered or a method called a through feed grinding method or creep feed grinding method for grinding the wafer while the wafer 22 and grindstone 35 are being rotated can be used. At this time, the wafer is divided into individual chips 22-$i$ if the backside of the wafer 22 is ground to reach the grooves 33. In this case, the wafer 22 can be continuously ground (and polished) even after the wafer is divided into individual chips 22-$i$ and it can be ground and polished by at least 5 μm. As a result, even if chipping occurs in a portion in which the side wall surface of the grooves 33 formed by the half-cut dicing process and the surface formed by the grinding and polishing process cross each other, the corresponding portion can be removed by the grinding and polishing process. A larger chipping region can be removed by increasing the grinding and polishing amount. However, the grinding and polishing amount may be set as required according to the thickness of the wafer 22, the thickness of the chip 22-$i$ at the time of completion and the like. Thus, the thickness of the chip 22-$i$ at the time of completion can be reduced to 30 to 50 μm, for example.

Further, a grinding stone with one type of abrasive grain diameter may be used when the wafer 22 is divided into individual chips 22-$i$ by grinding the backside of the wafer to reach the grooves 33. However, when a reduction in the grinding time and prevention of occurrence of chipping are both taken into consideration, it is preferable to grind the wafer at two or more stages by use of grinding stones with at least two types of abrasive grain diameters. That is, first, the wafer is ground and polished by use of a grinding stone with a large abrasive grain diameter of approximately #360 (the main abrasive grain diameter is 40 to 60 μm). Then, the wafer is ground and polished by use of a grinding stone with a small abrasive grain diameter of approximately #2000 (the main abrasive grain diameter is 4 to 6 μm) and divided into individual chips 22-$i$. Thus, time required for dividing the wafer 22 into individual chips 22-$i$ can be reduced and occurrence of chipping can be suppressed since the grinding stone with the small abrasive grain diameter is used when the wafer is finally divided.

[Modification 17]

In the above embodiment and modifications, if the ground surface is etched after the backside grinding to perform a mirror finishing process, thin chips which have less backside chipping and small warps can be formed. Further, occurrence of cracks at the time of transfer and occurrence of poor connection at the time of wire bonding can be reduced. At this time, the adhesive layer 23 acts as a reinforcement member of the wafer or chip to effectively suppress occurrence of cracks, breakage and the like.

As described above, according to one aspect of this invention, a semiconductor device and a manufacturing method thereof which can suppress occurrence of backside chipping, enhance the bending strength even in a thin chip and suppress occurrence of poor connection.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device comprising:

performing first ball bonding to bond a first bonding ball onto a first bump which is formed on a first pad of a first semiconductor chip having a first adhesive layer formed on an element forming surface thereof and is exposed from a surface of the first adhesive layer, performing first wedge bonding with respect to a first wiring layer formed on a printed circuit board by extending a bonding wire from the first bonding ball, mounting a second semiconductor chip having a second adhesive layer formed on an element forming surface thereof, having a second bump formed on a second pad and exposed from a surface of the second adhesive layer and smaller than the first semiconductor chip on a portion of the first adhesive layer which lies inside the first pad on the first semiconductor chip, performing second ball bonding to bond a second bonding ball onto a second bump on the second semiconductor chip, performing second wedge bonding with respect to a second wiring layer formed on the printed circuit board by extending a bonding wire from the second bonding ball, forming the first bump on the first pad of the element forming surface of the first semiconductor chip before performing the first ball bonding, forming the first adhesive layer on the element forming surface of the first semiconductor chip such that an upper portion of the first bump is exposed from the surface of the first adhesive layer, forming the second bump on the second pad of the element forming surface of the second semiconductor chip, and forming the second adhesive layer on the element forming surface of the second semiconductor chip such that an upper portion of the second bump is exposed from the surface of the second adhesive layer.

2. The method according to claim 1, further comprising sealing the first and second semiconductor chips, first and second bonding wires and the surface of the printed circuit board.

3. The method according to claim 1, wherein the first and second semiconductor chips are formed by dividing a semiconductor wafer on which elements have already been formed by use of a dicing before grinding method and the first and second adhesive layers and the first and second bumps are formed before the semiconductor wafer is divided.

4. The method according to claim 1, further comprising:
mounting a spacer having a third adhesive layer formed on an upper surface thereof and smaller than the second semiconductor chip on a portion of the second adhesive layer which lies inside the second pad on the second semiconductor chip,
mounting a third semiconductor chip having a fourth adhesive layer formed on an element forming surface thereof, having a third bump formed on a third pad and exposed from a surface of the fourth adhesive layer and having substantially the same size as the second semiconductor chip on the third adhesive layer,
performing third ball bonding to bond a third bonding ball onto a third bump on the third semiconductor chip, and
performing third wedge bonding with respect to a third wiring layer formed on the printed circuit board by extending a bonding wire from the third bonding ball,
wherein a process for mounting the third semiconductor chip on the third adhesive layer is a thermocompression bonding process in which the third adhesive layer is melted to form a fillet and the second semiconductor chip in the third ball bonding step is reinforced by causing the fillet to reach a second ball bonding portion of the second semiconductor chip.

5. The method according to claim 4, wherein the third semiconductor chip is formed by dividing a semiconductor wafer on which elements have already been formed by use of a dicing before grinding method and the fourth adhesive layer and the third bump are formed before the semiconductor wafer is divided.

6. The method according to claim 4, further comprising sealing the first, second and third semiconductor chips, first, second and third bonding wires and the surface of the printed circuit board.

7. A method of manufacturing a semiconductor device comprising:
performing first ball bonding to bond a first bonding ball onto a first bump which is formed on a first pad of a first semiconductor chip having a first adhesive layer formed on an element forming surface thereof and is exposed from a surface of the first adhesive layer,
performing first wedge bonding with respect to a first wiring layer formed on a printed circuit board by extending a bonding wire from the first bonding ball,
mounting a spacer having a second adhesive layer formed on an upper surface thereof and smaller than the first semiconductor chip on a portion of the first adhesive layer which lies inside the first pad on the first semiconductor chip,
mounting a second semiconductor chip having a third adhesive layer formed on an element forming surface thereof, having a second bump formed on a second pad and exposed from a surface of the third adhesive layer and having substantially the same size as the first semiconductor chip on the second adhesive layer,
performing second ball bonding to bond a second bonding ball onto a second bump on the second semiconductor chip, and
performing second wedge bonding with respect to a second wiring layer formed on the printed circuit board by extending a bonding wire from the second bonding ball,
wherein a process for mounting the second semiconductor chip on the second adhesive layer is a thermocompression bonding process in which the second adhesive layer is melted to form a fillet and the second semiconductor chip in the second ball bonding step is reinforced by causing the fillet to reach a first ball bonding portion of the first semiconductor chip.

8. The method according to claim 7, wherein the first and second semiconductor chips are formed by dividing a semiconductor wafer on which elements have already been formed by use of a dicing before grinding method and the first and third adhesive layers and the first and second bumps are formed before the semiconductor wafer is divided.

9. The method according to claim 7, further comprising sealing the first and second semiconductor chips, first and second bonding wires and the surface of the printed circuit board.

10. The method according to claim 1, wherein the first bump and the second bump each include one of a ball bump and a plated bump.

11. The method according to claim 7, further comprising:
forming the first bump on the first pad of the element forming surface of the first semiconductor chip before performing the first ball bonding; and
forming the first adhesive layer on the element forming surface of the first semiconductor chip such that an upper portion of the first bump is exposed from the surface of the first adhesive layer.

12. The method according to claim 11, further comprising:
forming the second bump on the second pad of the element forming surface of the second semiconductor chip; and
forming the second adhesive layer on the element forming surface of the second semiconductor chip such that an upper portion of the second bump is exposed from the surface of the second adhesive layer.

13. The method according to claim 7, wherein the first bump and the second bump each include one of a ball bump and a plated bump.

14. A method of manufacturing a semiconductor device comprising:
forming a first bump including one of a ball bump and a plated bump on a first pad of an element forming surface of a first semiconductor wafer;
forming a first adhesive layer on the element forming surface of the first semiconductor wafer such that an upper portion of the first bump is exposed from a surface of the first adhesive layer;
dividing the first semiconductor wafer into first semiconductor chips;
wire-bonding the first bump of the first semiconductor chip to a first wiring layer formed on a printed circuit board;
forming a second bump including one of a ball bump and a plated bump on a second pad of an element forming surface of a second semiconductor wafer;
dividing the second semiconductor wafer into second semiconductor chips whose size is smaller than that of the first semiconductor chips;
mounting the second semiconductor chip on the first adhesive layer inside the first pad of the first semiconductor chip;
wire-bonding the second bump of the second semiconductor chip to a second wiring layer formed on the printed circuit board,
after forming the second bump, forming a second adhesive layer on the element forming surface of the second semiconductor chip such that an upper portion of the second bump is exposed from a surface of the second adhesive layer;
forming a third bump on a third pad of an element forming surface of a third semiconductor chip whose size is smaller that of the second semiconductor chip; and mounting the third semiconductor chip on the second adhesive layer inside the second pad of the second semiconductor chip.

15. The method according to claim 14, further comprising sealing a surface of each of the first semiconductor chip, the second semiconductor chip, the first bonding wire, the second bonding wire and the printed circuit board.

* * * * *

UNITED STATES PATENT AND TRADEMARK OFFICE
CERTIFICATE OF CORRECTION

PATENT NO. : 7,833,836 B2  Page 1 of 1
APPLICATION NO. : 12/347956
DATED : November 16, 2010
INVENTOR(S) : Takyu et al.

It is certified that error appears in the above-identified patent and that said Letters Patent is hereby corrected as shown below:

Claim 14, column 22, line 67, change "smaller that" to --small than that--.

Signed and Sealed this
First Day of February, 2011

David J. Kappos
*Director of the United States Patent and Trademark Office*